(12) United States Patent
Wakabayashi et al.

(10) Patent No.: US 7,867,826 B2
(45) Date of Patent: Jan. 11, 2011

(54) SEMICONDUCTOR DEVICE PACKAGED INTO CHIP SIZE AND MANUFACTURING METHOD THEREOF

(75) Inventors: Takeshi Wakabayashi, Sayama (JP); Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 355 days.

(21) Appl. No.: 12/218,685

(22) Filed: Jul. 17, 2008

(65) Prior Publication Data

US 2008/0286903 A1 Nov. 20, 2008

Related U.S. Application Data

(62) Division of application No. 11/226,769, filed on Sep. 14, 2005, now Pat. No. 7,417,330.

(30) Foreign Application Priority Data

| Sep. 17, 2004 | (JP) | ............................ 2004-270646 |
| Mar. 31, 2005 | (JP) | ............................ 2005-100737 |

(51) Int. Cl.
*H01L 21/00* (2006.01)

(52) U.S. Cl. .............................. 438/113; 257/E21.599; 257/E23.126

(58) Field of Classification Search ................... 438/113; 257/E21.599, E23.126
See application file for complete search history.

(56) References Cited

U.S. PATENT DOCUMENTS

| 4,472,730 | A | 9/1984 | Ohta |
| 5,049,596 | A | 9/1991 | Fujimoto et al. |
| 5,814,894 | A | 9/1998 | Igarashi et al. |
| 6,034,421 | A | 3/2000 | Tokunaga |
| 6,316,832 | B1 | 11/2001 | Tsuzuki et al. |
| 6,391,687 | B1 | 5/2002 | Cabahug et al. |
| 6,744,124 | B1 | 6/2004 | Chang et al. |
| 6,770,971 | B2 | 8/2004 | Kouno et al. |
| 6,777,263 | B1* | 8/2004 | Gan et al. .................... 438/106 |
| 7,274,101 | B2* | 9/2007 | Tomita et al. ............... 257/730 |
| 2007/0247821 | A1* | 10/2007 | Kobayakawa et al. ....... 361/743 |

FOREIGN PATENT DOCUMENTS

| TW | 2001-332643 A | 11/2001 |
| TW | 552667 | 9/2003 |
| TW | 561597 | 11/2003 |
| TW | 586192 | 5/2004 |

\* cited by examiner

*Primary Examiner*—Trung Dang
(74) *Attorney, Agent, or Firm*—Holtz, Holtz, Goodman & Chick, P.C.

(57) ABSTRACT

A semiconductor device includes a semiconductor substrate having an integrated circuit and at least one connection pad, and at least one external connection electrode electrically connected with the connection pad. A first sealing material is provided on the semiconductor substrate around the external connection electrode, each impurity concentration of an Na ion, a K ion, a Ca ion and Cl ion contained in the first sealing material being not greater than 10 ppm. A second sealing material is provided on at least one of a lower surface and a peripheral side surface of the semiconductor substrate, a total impurity concentration of an Na ion, a K ion, a Ca ion and a Cl ion contained in the second sealing material being not smaller than 100 ppm.

8 Claims, 26 Drawing Sheets

SEMICONDUCTOR DEVICE PACKAGED INTO CHIP SIZE AND MANUFACTURING METHOD THEREOF

This application is a divisional of application Ser. No. 11/226,769 filed Sep. 14, 2005 now U.S. Pat. No. 7,417,330 (issue fee paid) which is incorporated herein in its entirety by this reference.

CROSS-REFERENCE TO RELATED APPLICATIONS

This application is based upon and claims the benefit of priority from prior Japanese Patent Applications No. 2004-270646, filed Sep. 17, 2004; and No. 2005-100737, filed Mar. 31, 2005, the entire contents of both of which are incorporated herein by reference.

BACKGROUND OF THE INVENTION

1. Field of the Invention

The present invention relates to a semiconductor device packaged into a chip size and a manufacturing method thereof.

2. Description of the Related Art

The present invention is an improvement to the type of semiconductor devices having a conventional chip size and a configuration in which a semiconductor substrate has a lower surface carrying an integrated circuit and a plurality of connection pads connected with the integrated circuit, and being covered with a first sealing film. The upper surface and peripheral side surfaces of the semiconductor substrates are covered with a second sealing film. A wiring is provided on an upper surface of the second sealing film to be electrically connected with the connection pads, a columnar electrode is provided on each connection pad portion of the wiring and a periphery of the columnar electrode is covered with a third sealing film in order to increase a protection effect for an environment, e.g., dust, humidity, a mechanical damage and others as disclosed in Jpn. Pat. Appln. KOKAI Publication No. 2001-332643. In this case, the first to third sealing films are formed of an organic material such as an epoxy-based resin or a polyimide-based resin.

In the conventional semiconductor device, the wiring is provided on the upper surface of the second sealing film which covers the upper surface and the peripheral side surfaces of the semiconductor substrate, and the third sealing film covers the periphery of the columnar electrode provided on each connection pad portion of the wiring. Therefore, the wiring comes into contact with the second and third sealing films, and the columnar electrode is brought into contact with the third sealing film. Since an organic material such as an epoxy-based resin or a polyimide-based resin which is a material of the second and third sealing films contains impurities such as an Na ion, a K ion, a Ca ion and Cl ion, a high concentration of the impurities can be a factor which provokes corrosion of the wiring or the columnar electrode or short circuit between these members. In order to avoid such an inconvenience, each impurity concentration of the Na ion, the K ion, Ca ion and the Cl ion in an organic material such as an epoxy-based resin or a polyimide-based resin which is a material of the second and third sealing films must be greatly decreased to 10 ppm or lower, thereby increasing a sealing material cost.

BRIEF SUMMARY OF THE INVENTION

It is an object of the present invention to provide a semiconductor device which can reduce a sealing material cost and a manufacturing method thereof.

A semiconductor device and its manufacturing method according to the present invention are characterized in that an upper surface of a semiconductor substrate around a columnar electrode is covered with a first sealing film formed of a first sealing material having an impurity concentration of an Na ion, a K ion, a Ca ion and a Cl ion each of which is not greater than 10 ppm and peripheral side surfaces of the semiconductor device and the first sealing film are covered with a second sealing film formed of a second sealing material having a total impurity concentration of the Na ion, the K ion, the Ca ion and the Cl ion which is not smaller than 100 ppm.

According to the semiconductor device and its manufacturing method of the present invention, since the upper surface of the semiconductor substrate around the columnar electrode is covered with the first sealing film formed of the relatively expensive first sealing material having an impurity concentration of the Na ion, the K ion, the Ca ion and the Cl ion each of which being not greater than 10 ppm and peripheral side surfaces of the semiconductor substrate and the first sealing film are covered with the second sealing film formed of the relatively inexpensive second sealing material having a total impurity concentration of the Na ion, the K ion, the Ca ion and the Cl ion being not smaller than 100 ppm, the sealing material cost can be reduced due to use of the relatively inexpensive second sealing material as compared with the case where the relatively expensive first sealing material only is utilized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
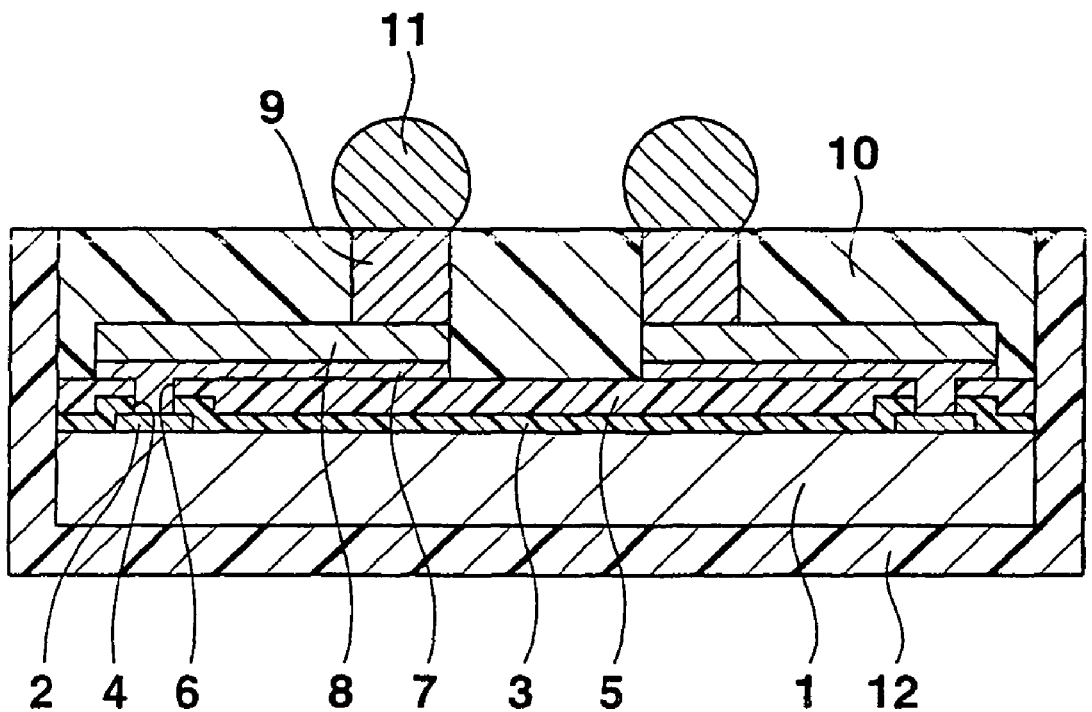
FIG. 1 is a cross-sectional view showing a semiconductor device according to an embodiment of the present invention.

FIG. 1 is a cross-sectional view of a semiconductor device according to an embodiment of the present invention. This semiconductor device is generally called a CSP (chip size package), and provided with a silicon substrate (a semiconductor substrate) 1. An integrated circuit (not shown) having a predetermined function is provided on an upper surface of the silicon substrate 1, and a plurality of connection pads 2 formed of, e.g., an aluminum-based metal are electrically connected with the integrated circuit at an upper surface peripheral portion.

An insulating film 3 formed of, e.g., silicon oxide or silicon nitride is provided on the upper surface of the silicon substrate 1 excluding a central portion of each connection pad 2, and the central portion of the connection pad 2 is exposed through an opening portion 4 provided to the insulating film 3. A protection film (an insulating film) 5 formed of, e.g., an epoxy-based resin or a polyimide-based resin is provided on an upper surface of the insulating film 3. In this case, each opening portion 6 is provided in the protection film 5 at a part corresponding to the opening portion 4 of the insulating film 3.

An underlying metal layer 7 formed of, e.g., copper is provided on an upper surface of the protection film 5. A wiring 8 formed of copper is provided on an entire upper surface of the underlying metal layer 7. One end portion of the underlying metal layer 7 is connected with each connection pad 2 through the opening portions 4 and 6 of the insulating film 3 and the protection film 5, and hence the wiring 8 is electrically connected with each connection pad. A columnar electrode (an external connection electrode) 9 formed of copper having a height of 80 to 150 μm is provided on an upper surface of a connection pad portion of the wiring 8.

A first sealing film 10 formed of a later-described first sealing material is provided on an upper surface of the protection film 5 including the wiring 8 in such a manner that an upper surface of the first sealing film 10 is set on the same level as an upper surface of the columnar electrode 9. Each solder ball 11 is provided on the upper surface of the columnar electrode 9. A second sealing film 12 formed of a later-described second sealing material is provided on respective peripheral side surfaces of the silicon substrate 1, the insulating film 3, the protection film 5 and the first sealing film 10 and a lower surface of the silicon substrate 1.

Materials of the first and second sealing films 10 and 12 will now be described. Although materials of the first and second sealing films 10 and 12 may be any organic material such as an epoxy-based resin, a polyimide-based resin, an acrylic resin, a silicone-based resin, a rubber-based resin, a bismaleimide-based resin and others, it is desirable to use a material suitable for each sealing material since characteristics required for the first and second sealing films 10 and 21 are slightly different from each other.

That is, although the first sealing film 10 increases a protection effect for an environment such as dust, humidity, a mechanical damage and others, but it is necessary to prevent corrosion of the wiring 8 and the columnar electrode 9 and short circuit between these members from being generated. Therefore, as the first sealing material for forming the first sealing film 10, there is used a relatively expensive material in which each impurity concentration of an Na ion, a K ion, a Ca ion and a Cl ion is greatly reduced to 10 ppm or lower. Further, in manufacture of a semiconductor device, each impurity concentration of the Na ion, the K ion, the Ca ion and the Cl ion in the insulating film 3 and the protection film 5 formed in a clean room together with an electroconductive layer including the semiconductor layer or the connection pads 2 is not greater than 10 ppm.

On the other hand, although the second sealing film 12 increases a protection effect against a mechanical damage in particular, this film has less needs for preventing corrosion of the wiring 8 including the underlying metal layer 7 and the columnar electrode 9 and short circuit between these members from occurring. Therefore, the second sealing material for forming the second sealing film 12 may have a slightly high total impurity concentration of the Na ion, the K ion, the Ca ion and the Cl ion, and there is used a relatively inexpensive material in which this total impurity concentration is somewhat increased to 100 ppm or above as this second sealing material.

Further, in order to alleviate a stress caused due to a thermal expansion coefficient difference between the first and second sealing films 10 and 12 and the silicon substrate 1, mixing a silica filler or the like in the first and second sealing materials is generally carried out. However, in this case, it is desirable to use a mixing quantity suitable for each sealing film since characteristics required for the first and second sealing films 10 and 12 are slightly different from each other.

That is, since the first sealing film 10 covers the silicon substrate 1 including the wiring 8 and the columnar electrode 9, high reliability is required, and the first sealing film 10 having a small thermal expansion coefficient different between itself and the silicon substrate 1 is desirable. Therefore, as the first sealing material used to form the first sealing film 10, there is used one having a relatively large mixing quantity of a silica filler or the like, a thermal expansion coefficient which is close to that of the silicon substrate 1 (3.5 ppm/° C.) and is less than 20 ppm/° C.

On the other hand, since the second sealing film 12 covers the peripheral side surfaces of the silicon substrate 1, the insulating film 3, the protection film 5 and the first sealing film 10 and the lower surface of the silicon substrate 1, reliability as high as that of the first sealing film 10 is not required, and the second sealing film 12 which is somewhat softer than the first sealing film 10 is desirable in order to prevent the second sealing film 12 from being too hard due to mixing of a silica filler or the like, which results in occurrence of a crack. Therefore, as the second sealing material used to form the second sealing film 12, there is utilized one having a relatively small mixing quantity of a silica filler or the like and a thermal expansion coefficient which is not smaller than 20 ppm/° C.

As a result, the first sealing film 10 is formed of the relatively expensive first sealing material having an ion impurity concentration of each impurity portion which is not greater than 10 ppm and a thermal expansion coefficient which is less than 20 ppm/° C. The second sealing film 12 is formed of the relatively inexpensive sealing material having a total impurity concentration of impurities which is not smaller than 100 ppm and a thermal expansion coefficient which is not smaller than 20 ppm/° C. Therefore, a sealing material cost can be reduced by an amount corresponding to use of the relatively inexpensive second sealing material as compared with an example where the relatively expensive first sealing material alone is used.

FIRST EXAMPLE OF MANUFACTURING METHOD

Figure 2:
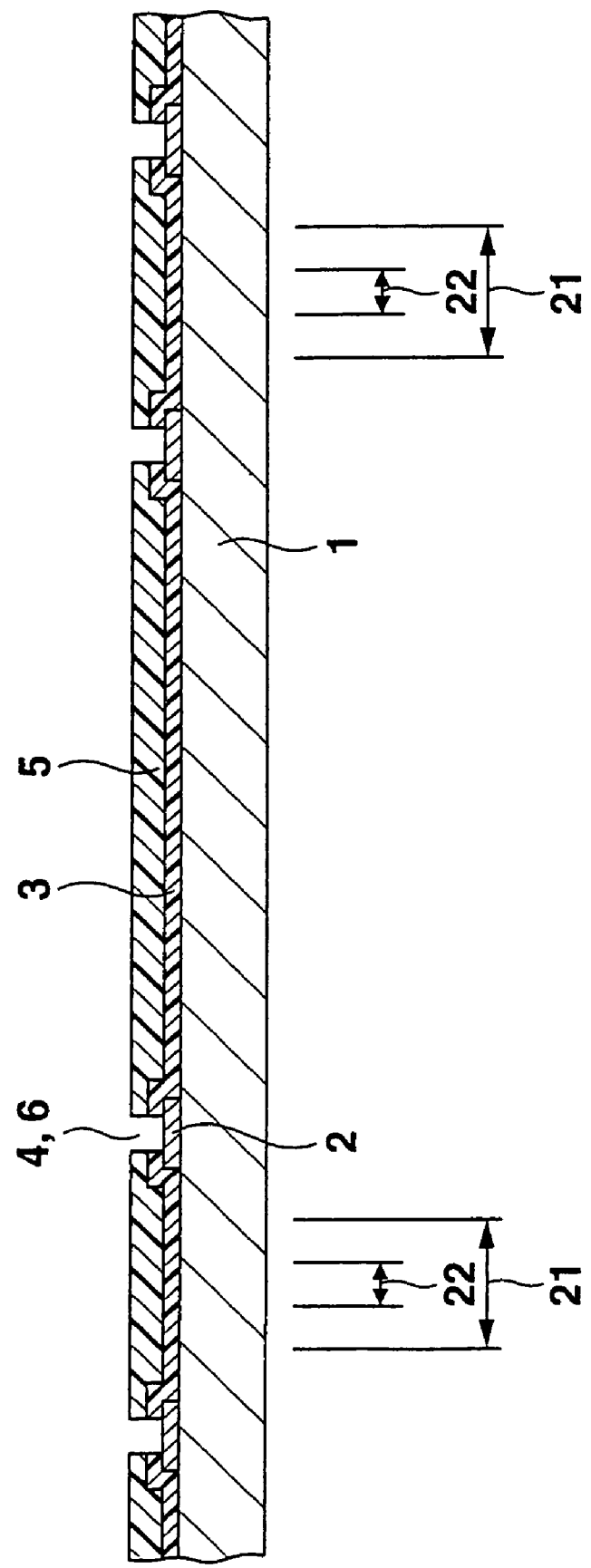
FIG. 2 is a cross-sectional view of a step prepared at first in a first example of a manufacturing method of the semiconductor device depicted in FIG. 1.

A first example of a manufacturing method of the semiconductor device depicted in FIG. 1 will now be described. First, as shown in FIG. 2, there is prepared a product having a configuration in which each connection pad 2 formed of an aluminum-based metal, an insulating film 3 formed of silicon oxide or silicon nitride and a protection film 5 formed of an epoxy-based resin or a polyimide-based resin are provided on a silicon substrate 1 in a wafer state, and a central portion of each connection pad 2 is exposed through opening portions 4 and 6 formed in the insulating film 3 and the protection film 5.

In the above-described configuration, an integrated circuit having a predetermined function is formed in a region where each semiconductor device is formed on the silicon substrate 1 in the wafer state, and each connection pad 2 is electrically connected with the integrated circuit formed in each corresponding region. It is to be noted that, in FIG. 2, a region denoted by reference numeral 21 is a region corresponding to a first dicing street, and a region designated by reference numeral 22 is a region corresponding to a second dicing street. In this case, the second dicing street 22 is a region corresponding to a central portion of the first dicing street 21 in a widthwise direction.

Figure 3:
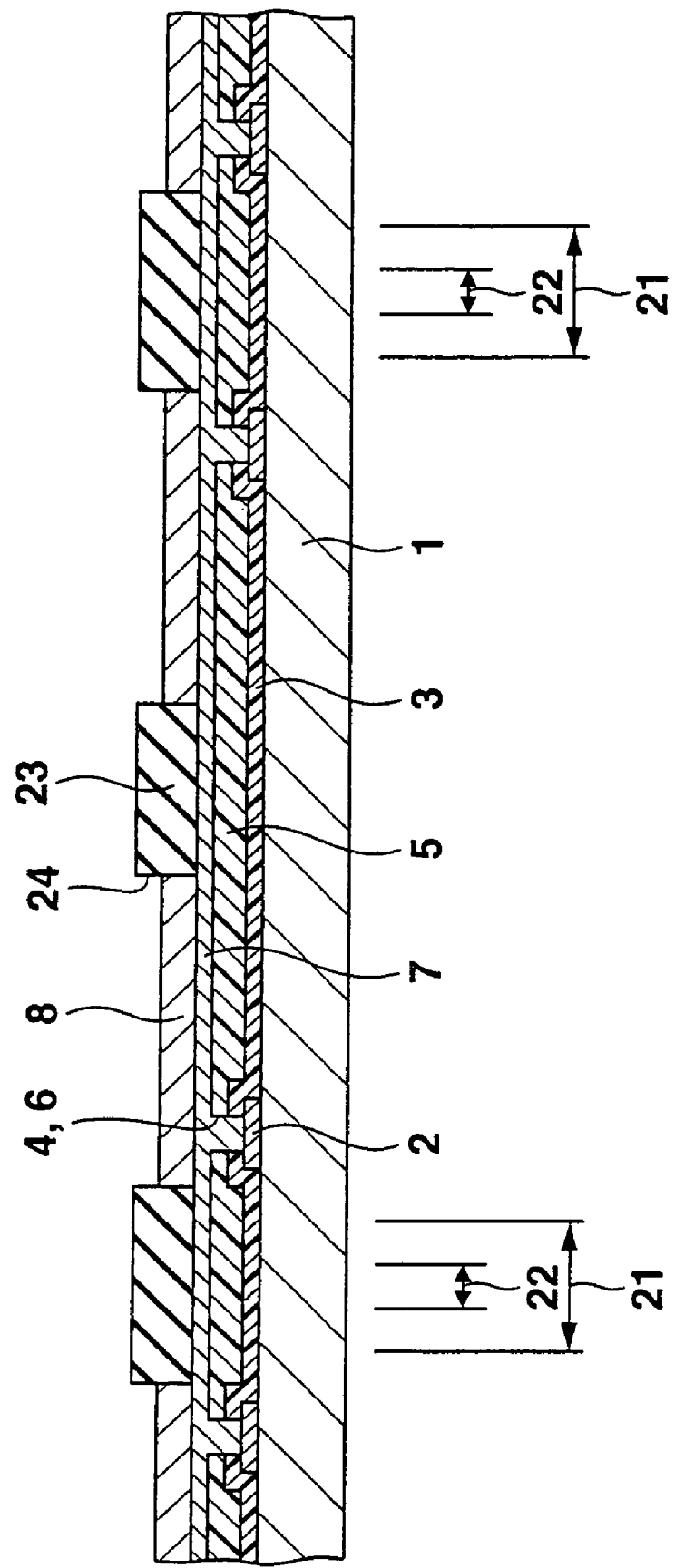
FIG. 3 is a cross-sectional view of a step following FIG. 2.

Then, as shown in FIG. 3, an underlying metal layer 7 is formed on an entire upper surface of the protection film 5 including the upper surface of each connection pad 2 exposed through the opening portions 4 and 6 of the insulating film 3 and the protection film 5. In this case, the underlying metal layer 7 may be a copper layer alone which is formed by electroless deposition, or a copper layer alone which is formed by sputtering, or a copper layer formed by sputtering on a thin film layer of, e.g., titanium formed by sputtering.

Next, a plating resist film 23 is pattern-formed on an upper surface of the underlying metal layer 7. In this case, an opening portion 24 is formed in the plating resist film 23 at a part corresponding to a region in which a wiring 8 is formed. Then, electroless deposition of copper is performed with the underlying metal layer 7 being used as a plating current path, thereby forming the wiring 8 on the upper surface of the underlying metal layer 7 in the opening portion 24 of the plating resist film 23. Then, the plating resist film 23 is peeled off.

Figure 4:
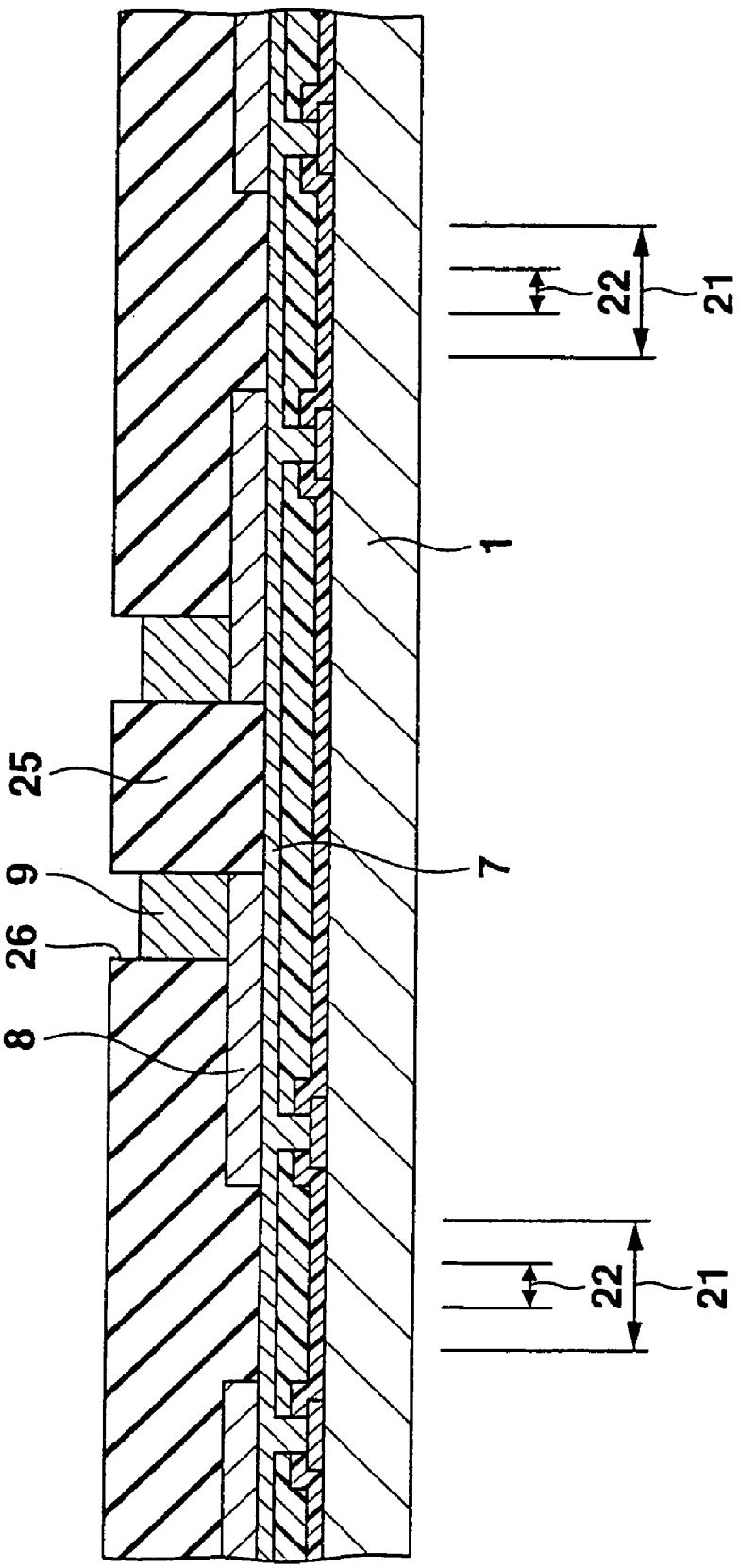
FIG. 4 is a cross-sectional view of a step following FIG. 3.
Figure 5:
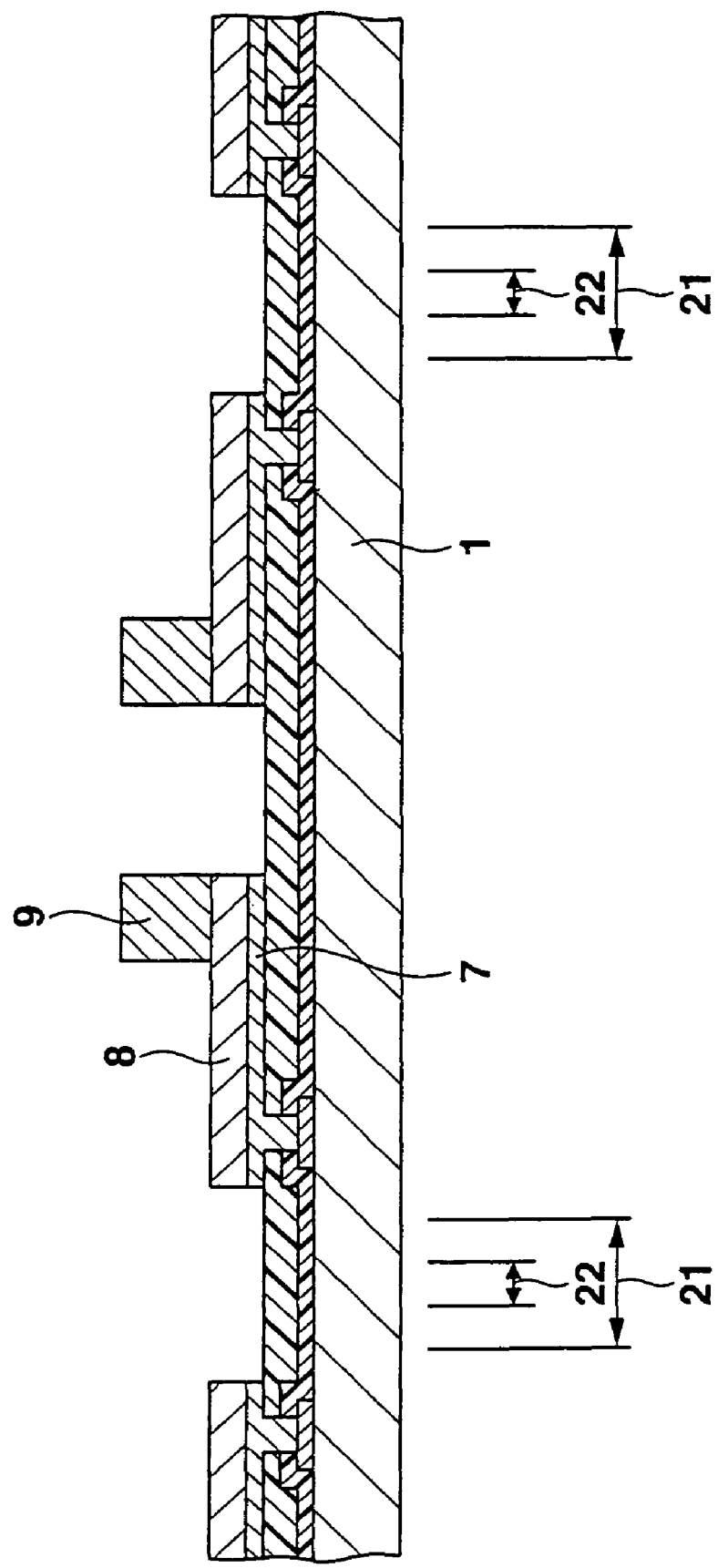
FIG. 5 is a cross-sectional view of a step following FIG. 4.

Next, as shown in FIG. 4, a plating resist film 25 is pattern-formed on the upper surface of the underlying metal layer 7 including the wiring 8. In this case, each opening portion 26 is formed in the plating resist film 25 at each part where a columnar electrode 9 is formed. Then, electroless deposition of copper is performed with the underlying metal layer 7 being used as a plating current path, thereby forming the columnar electrode 9 on a connection pad portion upper surface of the wiring 8 in the opening portion 26 of the plating resist film 25. Next, when the plating resist film 25 is peeled off and then an unnecessary part of the underlying metal layer 7 is etched and removed with the wiring 8 being used as a mask, the underlying metal layer 7 remains under the wiring 8 only as shown in FIG. 5.

Figure 6:
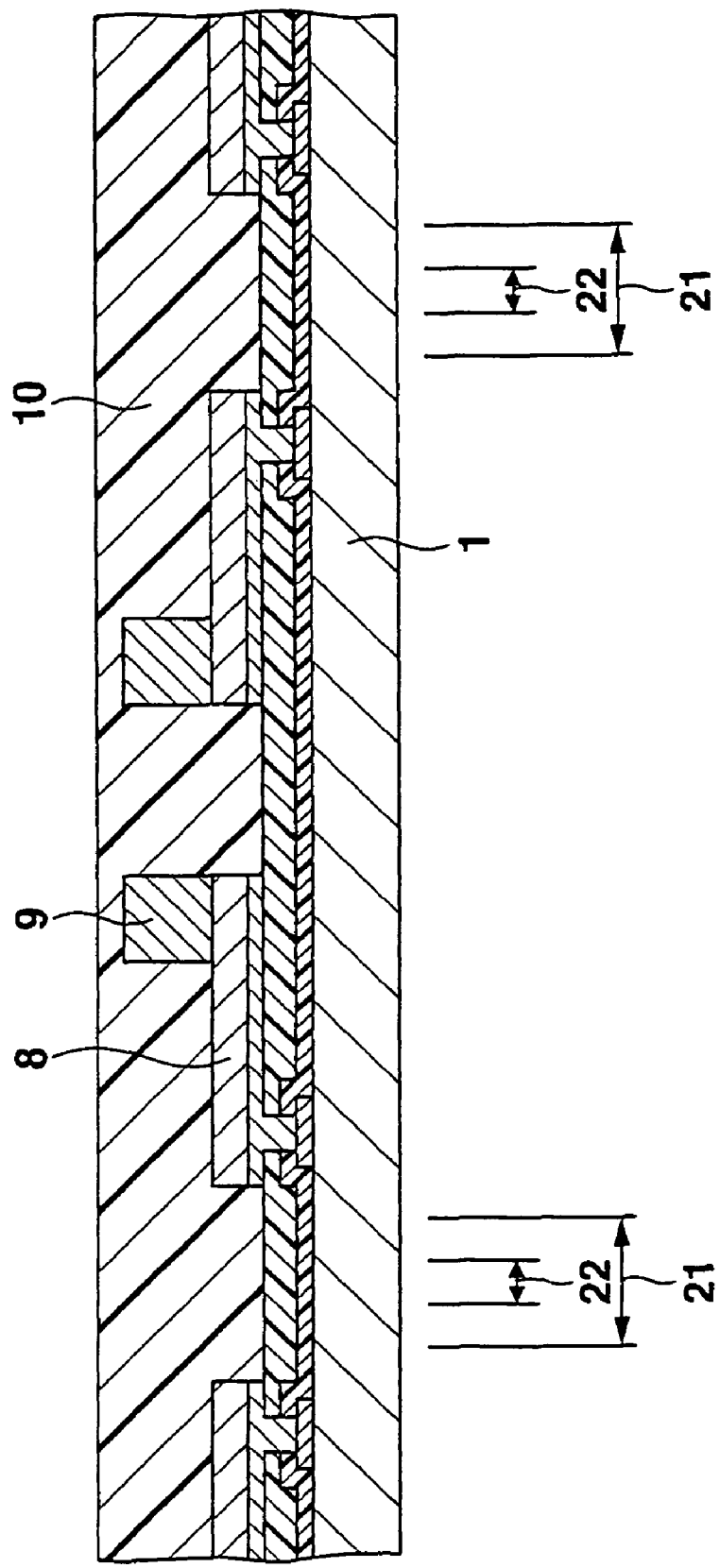
FIG. 6 is a cross-sectional view of a step following FIG. 5.

Then, as shown in FIG. 6, a first sealing film 10 formed of a first sealing material is formed on the entire upper surface of the protection film 5 including the columnar electrode 9 and the wiring 8 by a screen printing method, a spin coat method, a die coat method or the like in such a manner that a thickness of the first sealing film 10 becomes larger than a height of the columnar electrode 9. Therefore, in this embodiment, the upper surface of the columnar electrode 9 is covered with the first sealing film 10.

Figure 7:
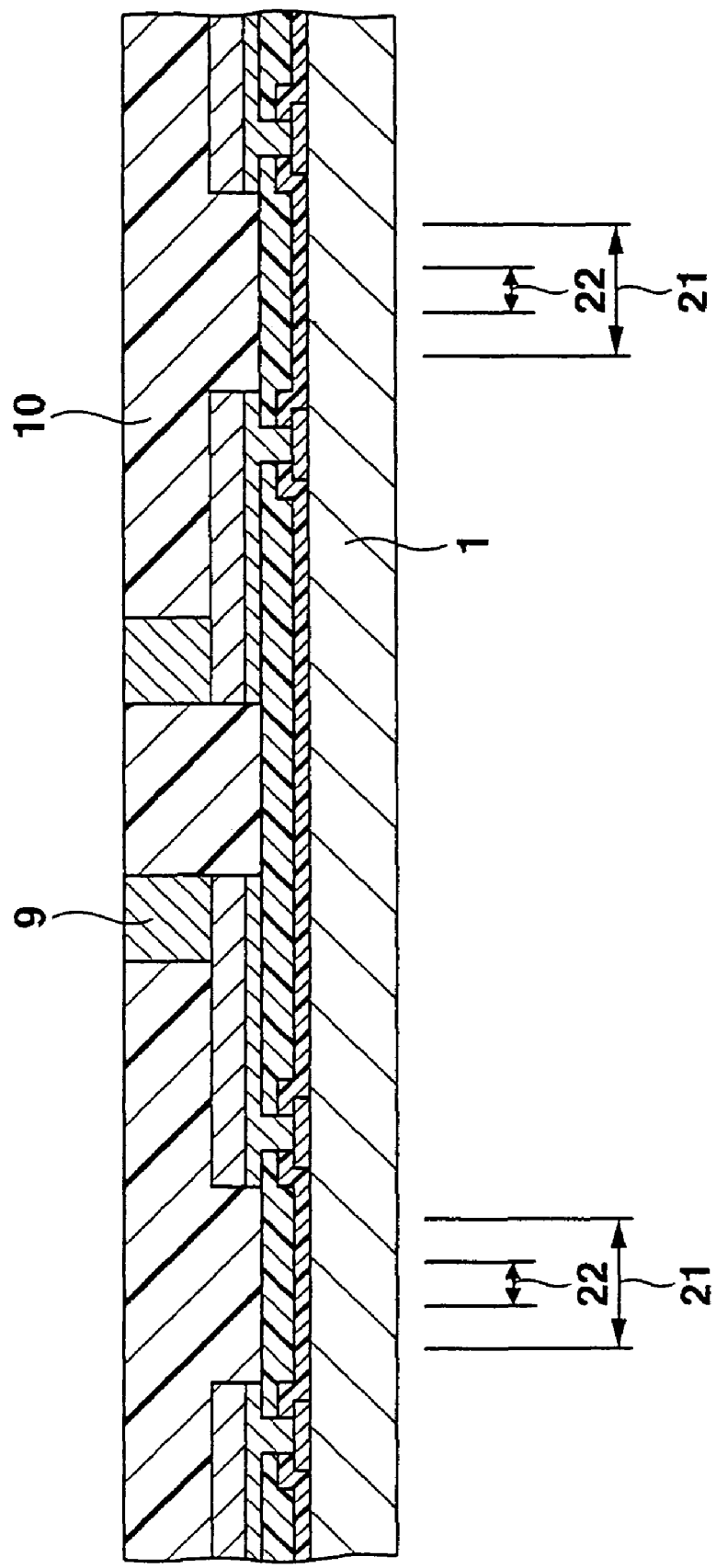
FIG. 7 is a cross-sectional view of a step following FIG. 6.

Then, an upper surface side of the first sealing film 10 and the columnar electrode 9 is appropriately polished to expose the upper surface of the columnar electrode 9 as shown in FIG. 7, and the upper surface of the first sealing film 10 including this exposed upper surface of the columnar electrode 9 is flattened. Here, since the height of the columnar electrode 9 formed by electroless deposition is irregular, the upper surface side of the columnar electrode 9 is appropriately polished in order to eliminate this irregularity and uniform the height of the columnar electrode 9.

Figure 8:
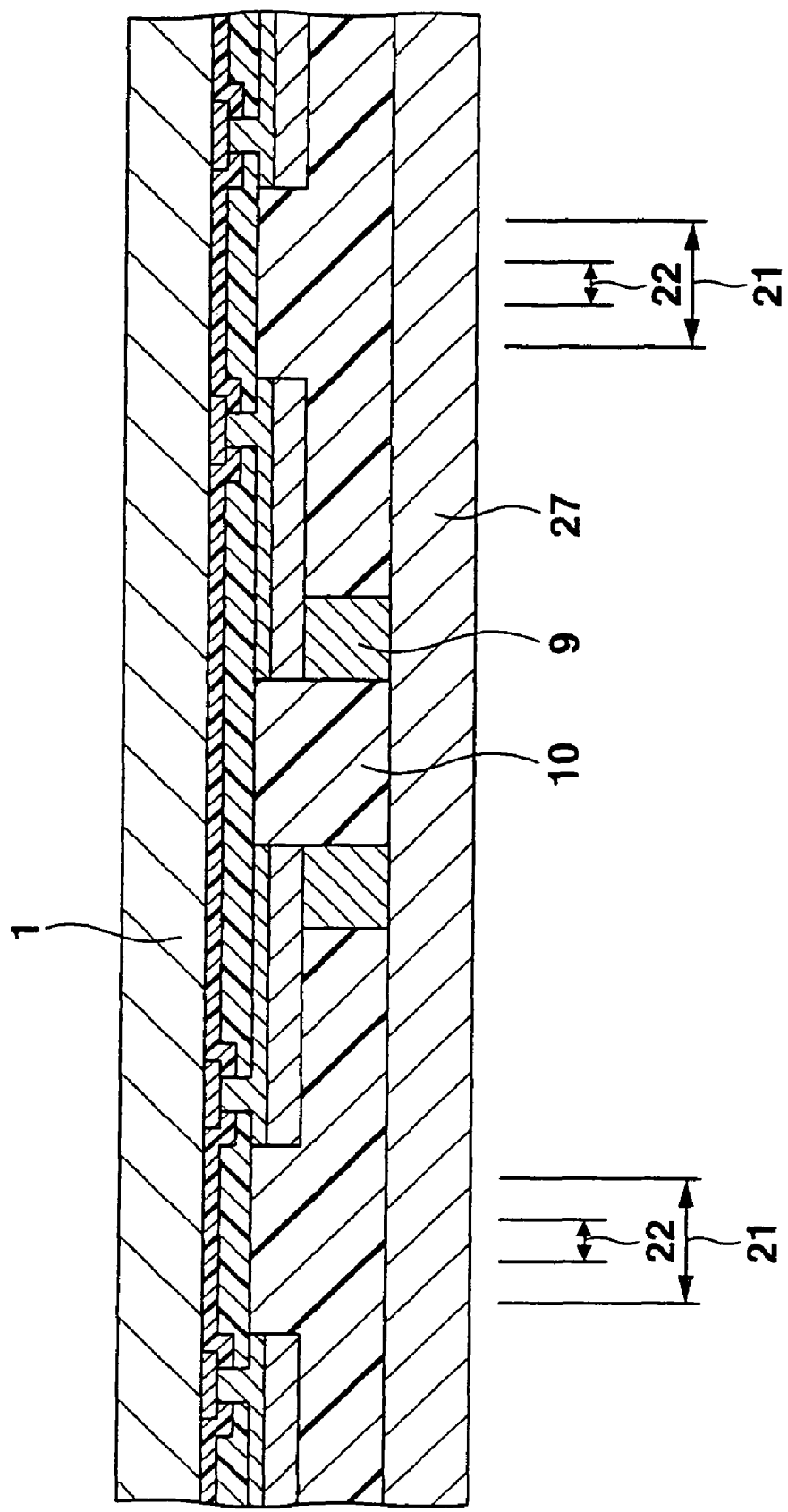
FIG. 8 is a cross-sectional view of a step following FIG. 7.
Figure 9:
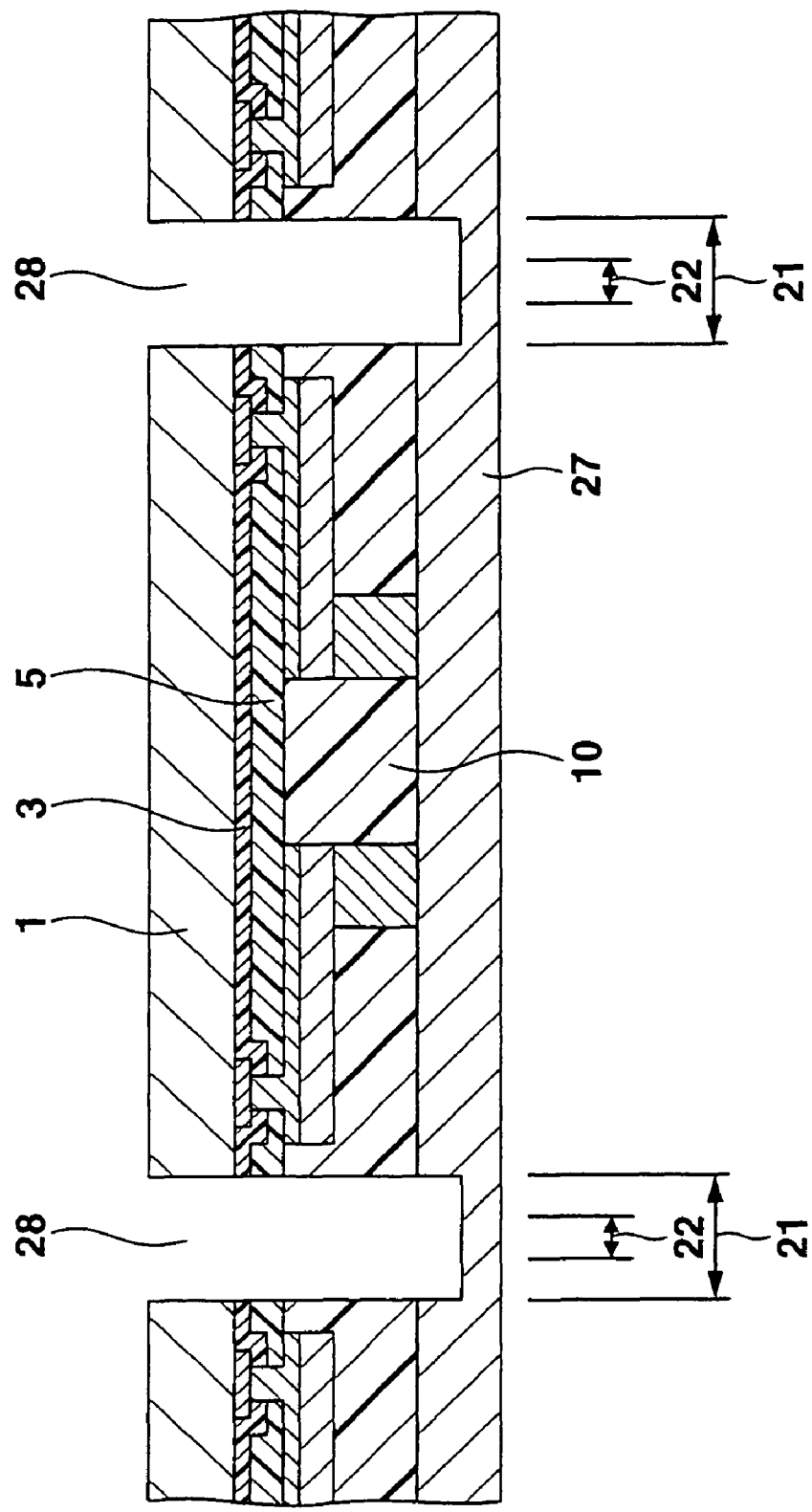
FIG. 9 is a cross-sectional view of a step following FIG. 8.

Then, the product shown in FIG. 7 is set upside down, and the lower surface of the first sealing film 10 including the lower surface of the columnar electrode 9 is attached on an upper surface of a first dicing film 27 as shown in FIG. 8. Next, as shown in FIG. 9, the silicon substrate 1, the insulating film 3, the protection film 5 and the first sealing film 10 are fully cut along each first dicing street 21 by a dicing method, a laser cut method or the like. In this case, these members are cut to an intermediate point of the first dicing film 27 in a thickness direction. Then, although the silicon substrate 1 in a wafer state is divided into each chip, since each chip is attached on the first dicing film 27, a groove 28 is formed between the respective chips including the upper surface of the first dicing film 27, i.e., in a region corresponding to the first dicing street 21.

Figure 10:
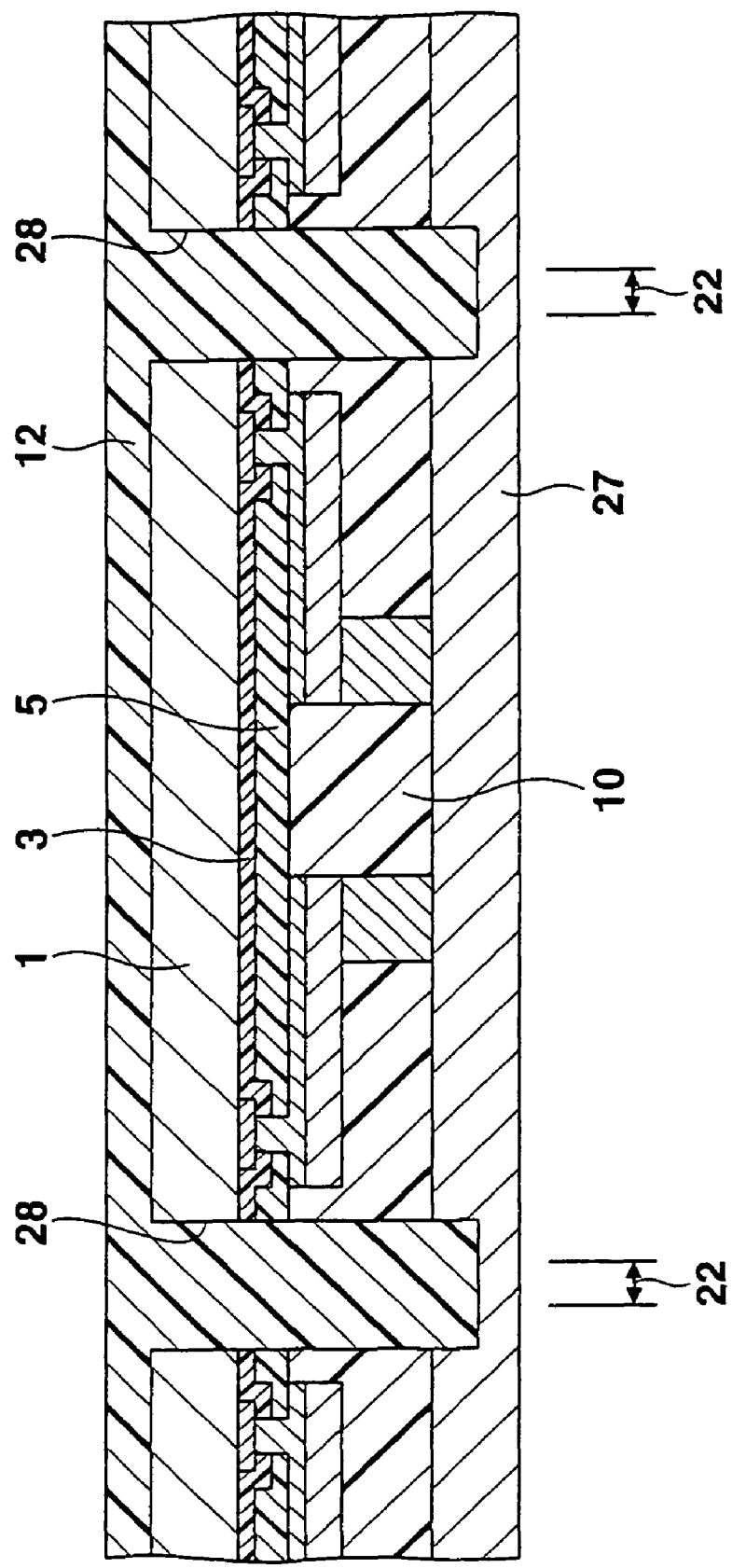
FIG. 10 is a cross-sectional view of a step following FIG. 9.

Next, as shown in FIG. 10, a second sealing film 12 formed of a second sealing material is formed on the entire upper surface of the silicon substrate 1 including the inside of the groove 28 by the screen printing method, the spin coat method, the die coat method or the like in such a manner that an upper surface of the second sealing film 12 becomes flat. In this state, peripheral side surfaces of the silicon substrate 1, the insulating film 3, the protection film 5 and the first sealing film 10 are covered with the second sealing film 12 formed in the groove 28. Further, since the silicon substrate 1 is divided into each chip, silicon substrate 1 can be hard to warp. Incidentally, when the first dicing film 27 is pulled and expanded in its peripheral direction to increase a width of the groove 28 and the second sealing material is applied in the groove 28 in this state, the second sealing material can be readily filled in the groove 28.

Figure 11:
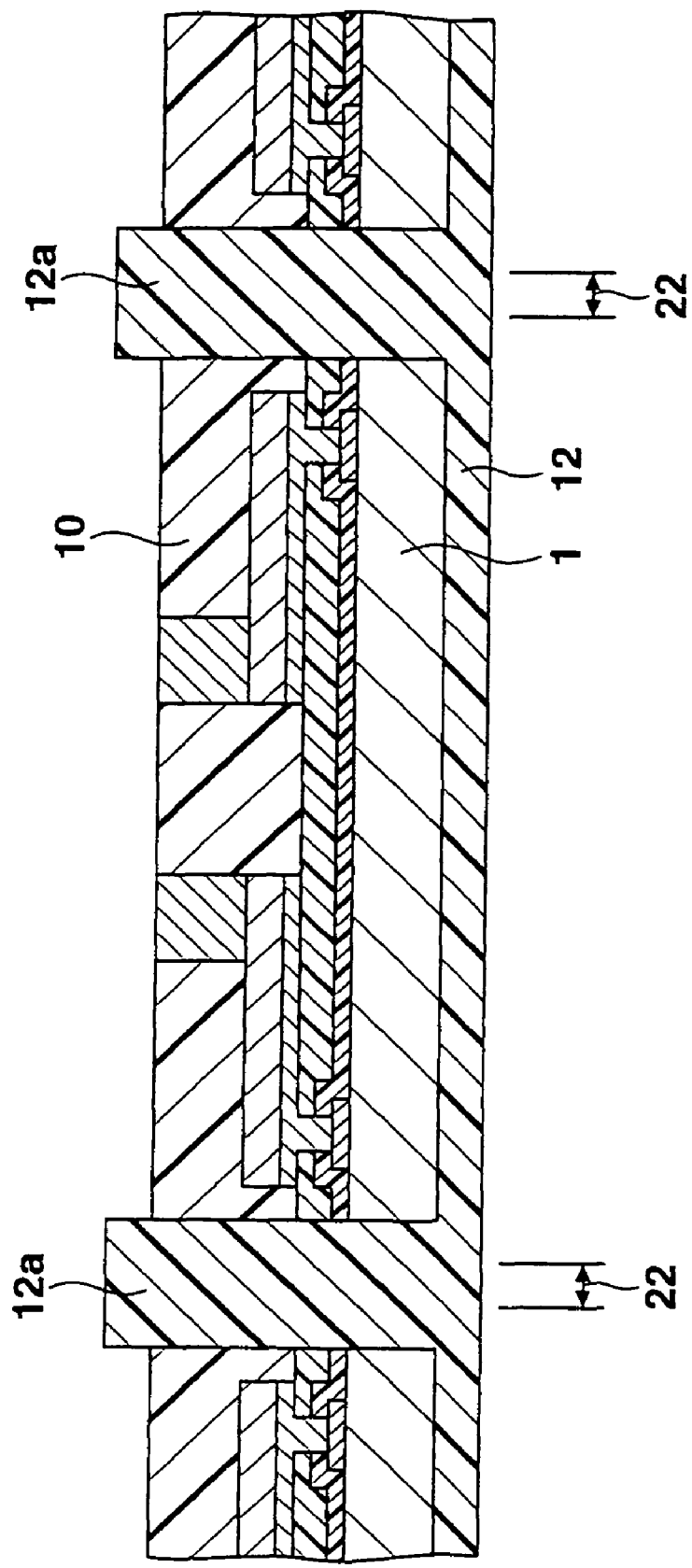
FIG. 11 is a cross-sectional view of a step following FIG. 10.
Figure 12:
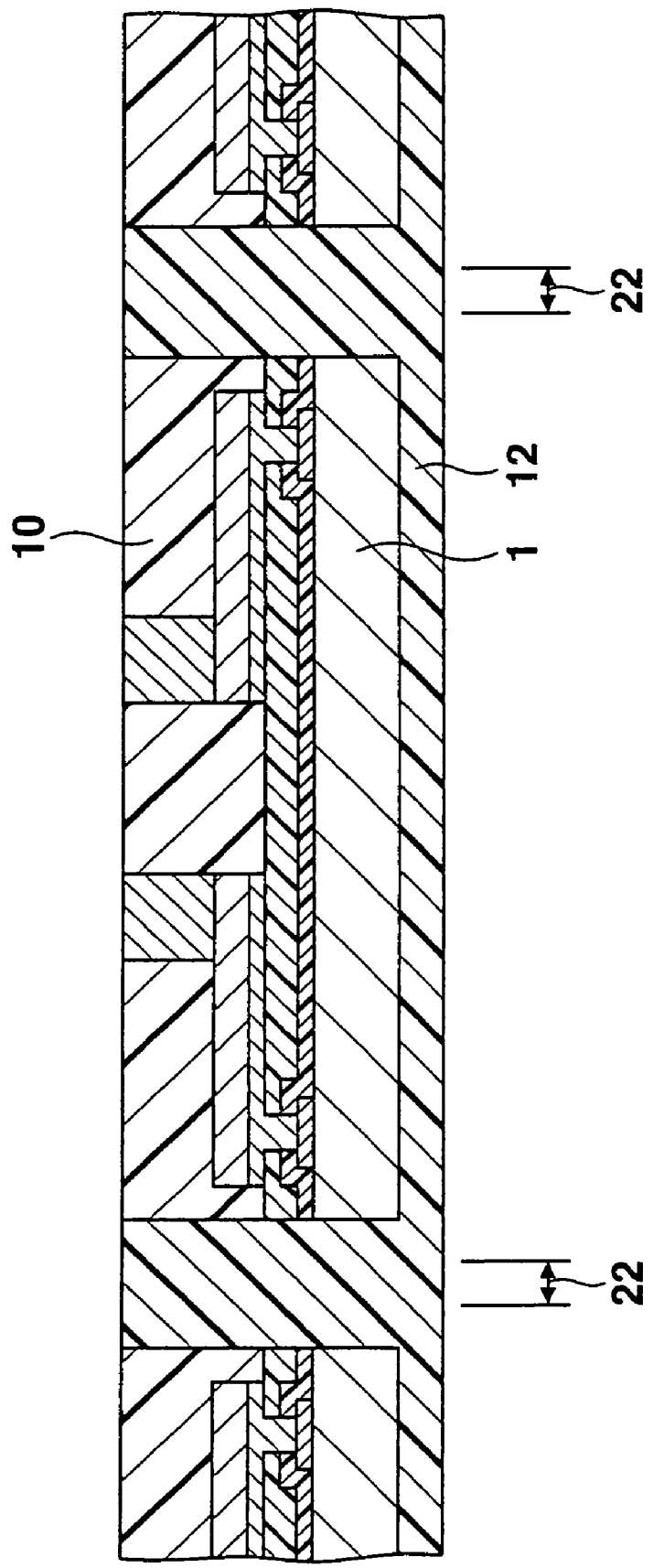
FIG. 12 is a cross-sectional view of a step following FIG. 11.

Then, when the product shown in FIG. 10 is set upside down and then the first dicing film 27 is peeled off, a state shown in FIG. 11 can be obtained. In this state, since the second sealing film 12 is formed between the respective chips and on the lower surface of each silicon substrate 1, the respective chips are integrated. Furthermore, as denoted by reference numeral 12a, the second sealing film 12 formed in the groove 28 formed in the first dicing film 27 shown in FIG. 10 protrudes from the upper surface of the first sealing film 10. Then, when this protruding portion 12a is polished and removed, the surface of the second sealing film 12 is set on the same level as the surface of the first sealing film 10 as shown in FIG. 12.

Figure 13:
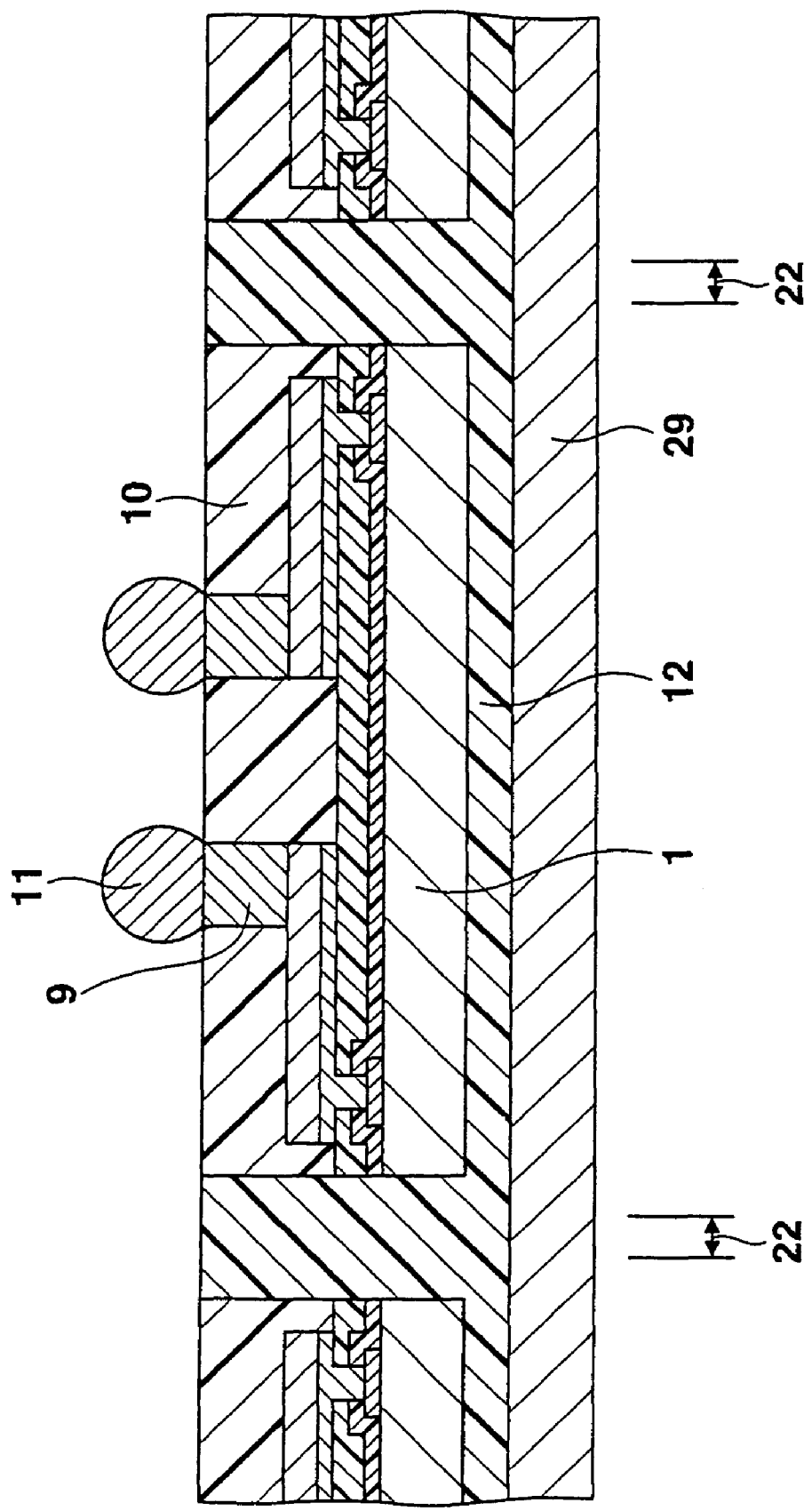
FIG. 13 is a cross-sectional view of a step following FIG. 12.
Figure 14:
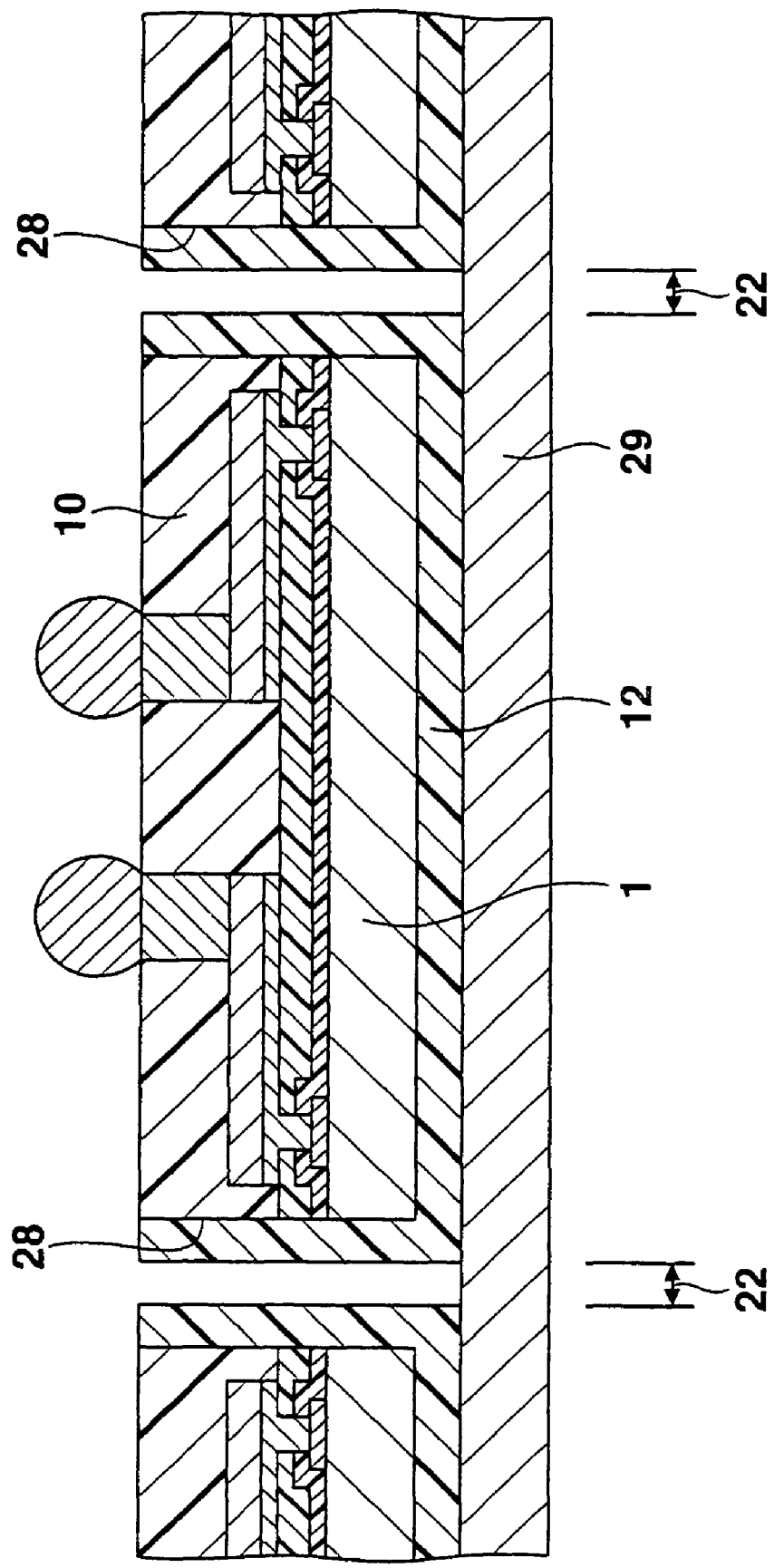
FIG. 14 is a cross-sectional view of a step following FIG. 13.

Next, as shown in FIG. 13, each solder ball 11 is formed on the upper surface of the columnar electrode 9. Then, the lower surface of the second sealing film 12 is attached on an upper surface of a second dicing film 29. Next, as shown in FIG. 14, a central portion in a widthwise direction of the second sealing film 12 formed in the groove 28 is fully cut along the second dicing street 22 by the dicing method, the laser cut method or the like. Then, when the silicon substrate 1 including the first and second sealing films 12 and others is peeled off from the second dicing film 29, the plurality of semiconductor devices shown in FIG. 1 can be obtained.

SECOND EXAMPLE OF MANUFACTURING METHOD

Figure 15:
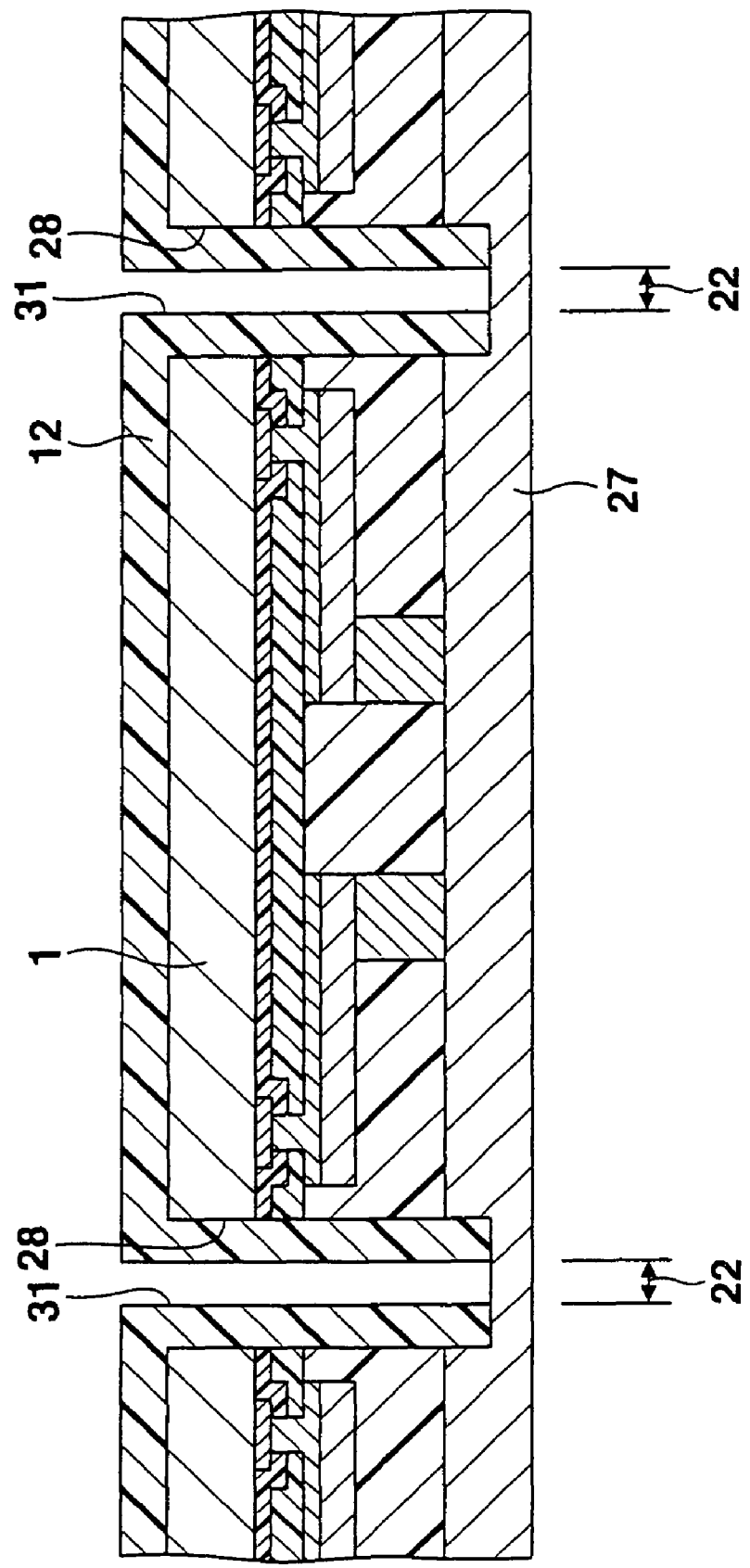
FIG. 15 is a cross-sectional view of a predetermined step in a second example of the manufacturing method of the semiconductor device depicted in FIG. 1.

A second example of the manufacturing method of the semiconductor device shown in FIG. 1 will now be described. In this case, after the step depicted in FIG. 10, the central portion in the widthwise direction of the second sealing film 12 formed in the groove 28 is fully cut along the second dicing street 22 by the dicing method, the laser cut method or the like to form each groove 31 as shown in FIG. 15. In this state, although the silicon substrate 1 including the second sealing film 12 and others is divided into each chip by the groove 31, the silicon substrate 1 is attached on the first dicing film 27 and hence it is not discretely divided.

Figure 16:
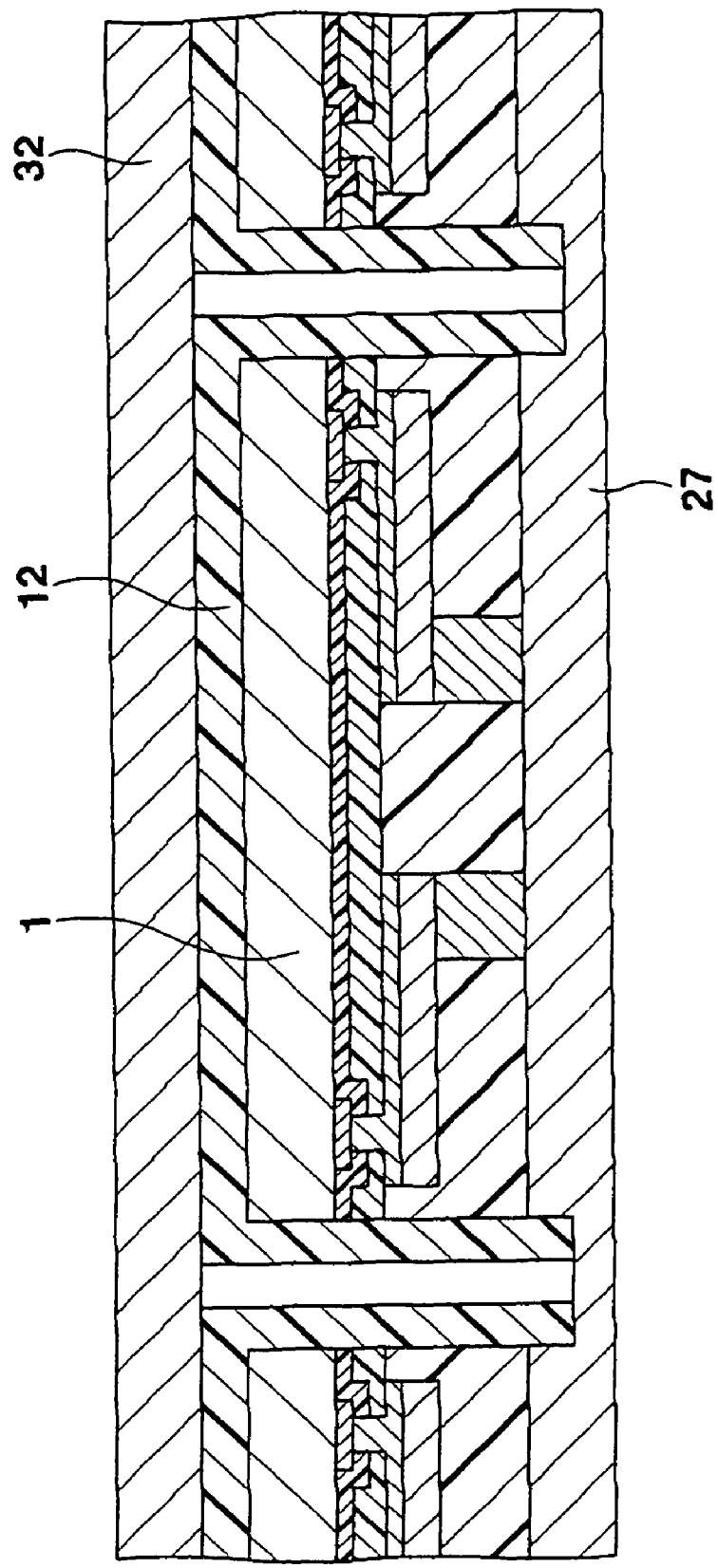
FIG. 16 is a cross-sectional view of a step following FIG. 15.
Figure 17:
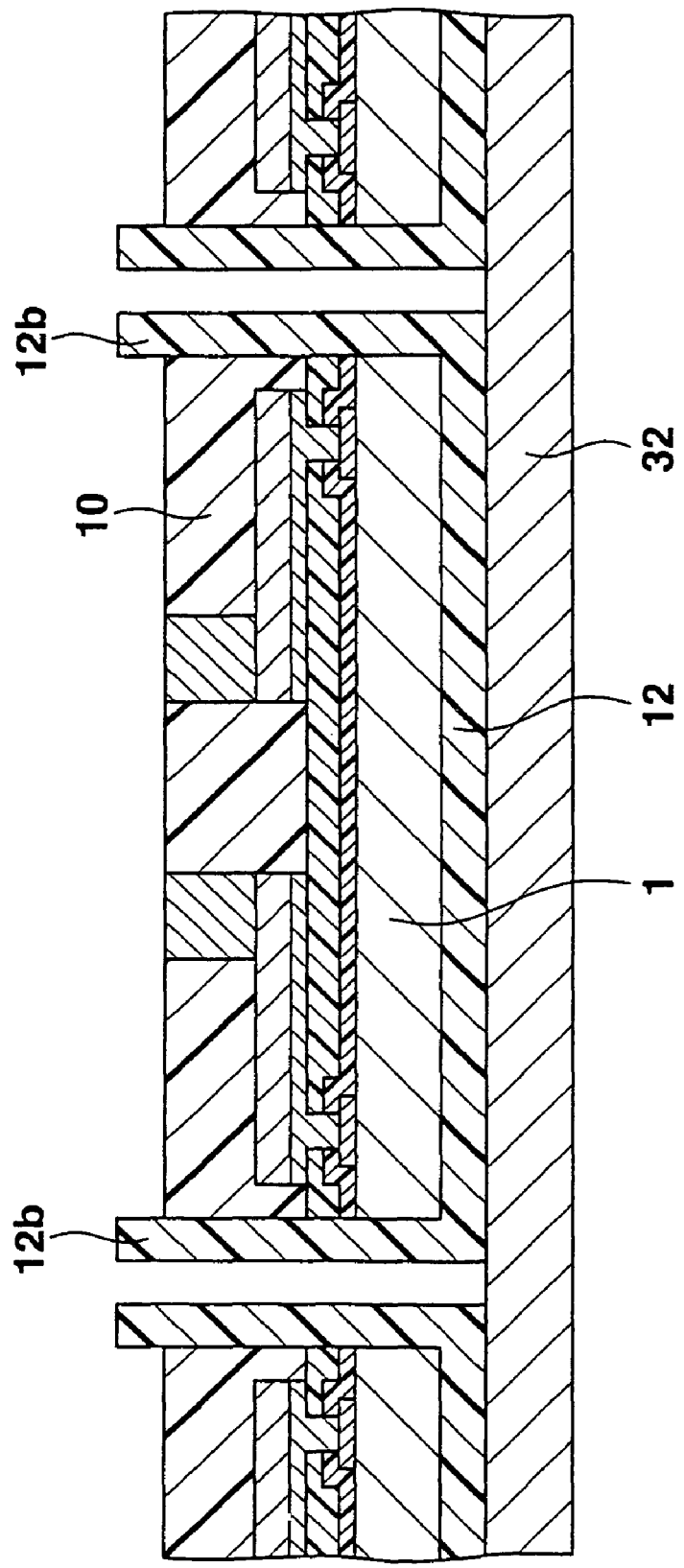
FIG. 17 is a cross-sectional view of a step following FIG. 16.
Figure 18:
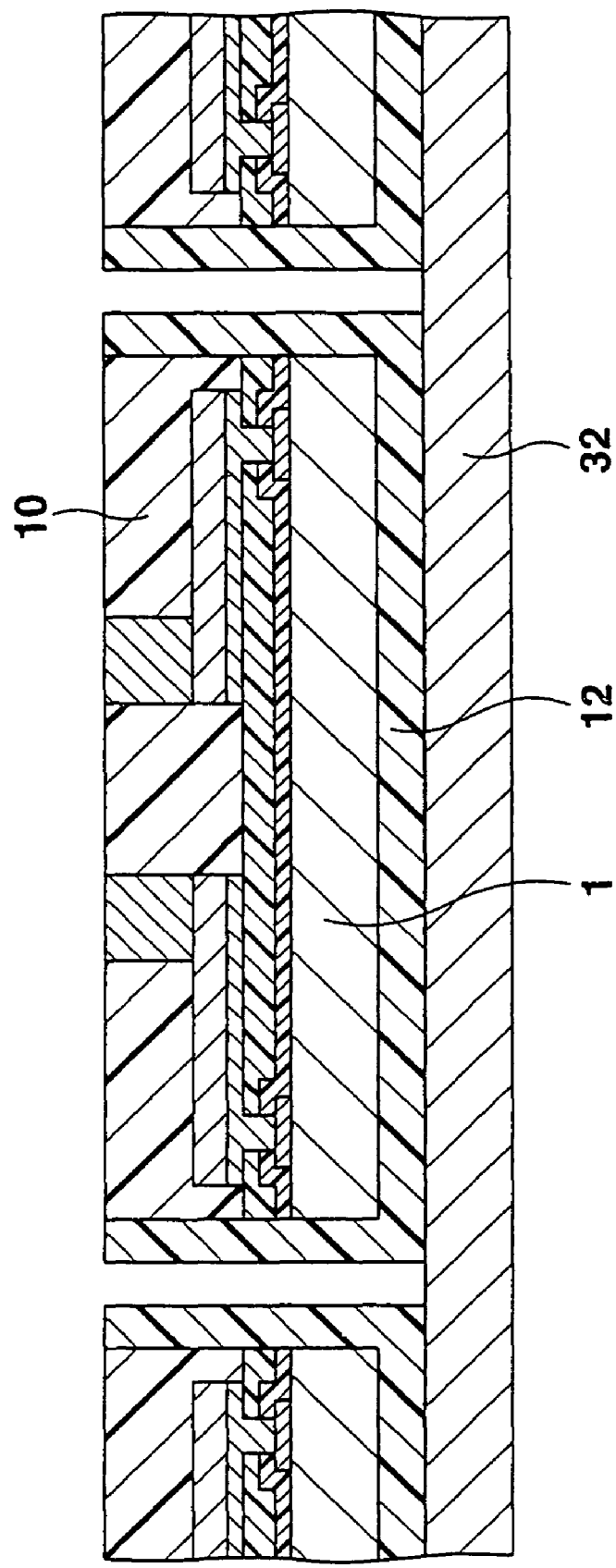
FIG. 18 is a cross-sectional view of a step following FIG. 17.

Then, as shown in FIG. 16, a support film 32 is attached on the upper surface of the second sealing film 12. Next, when the product shown in FIG. 16 is set upside down and the first dicing film 27 is peeled off, a state shown in FIG. 17 can be obtained. In this state, as denoted by reference numeral 12b, the second sealing film 12 formed in the groove 28 formed on the first dicing film 27 depicted in FIG. 15 protrudes from the upper surface of the first sealing film 10. Then, when this protruding portion 12b is polished and removed, a state shown in FIG. 18 is obtained.

Figure 19:
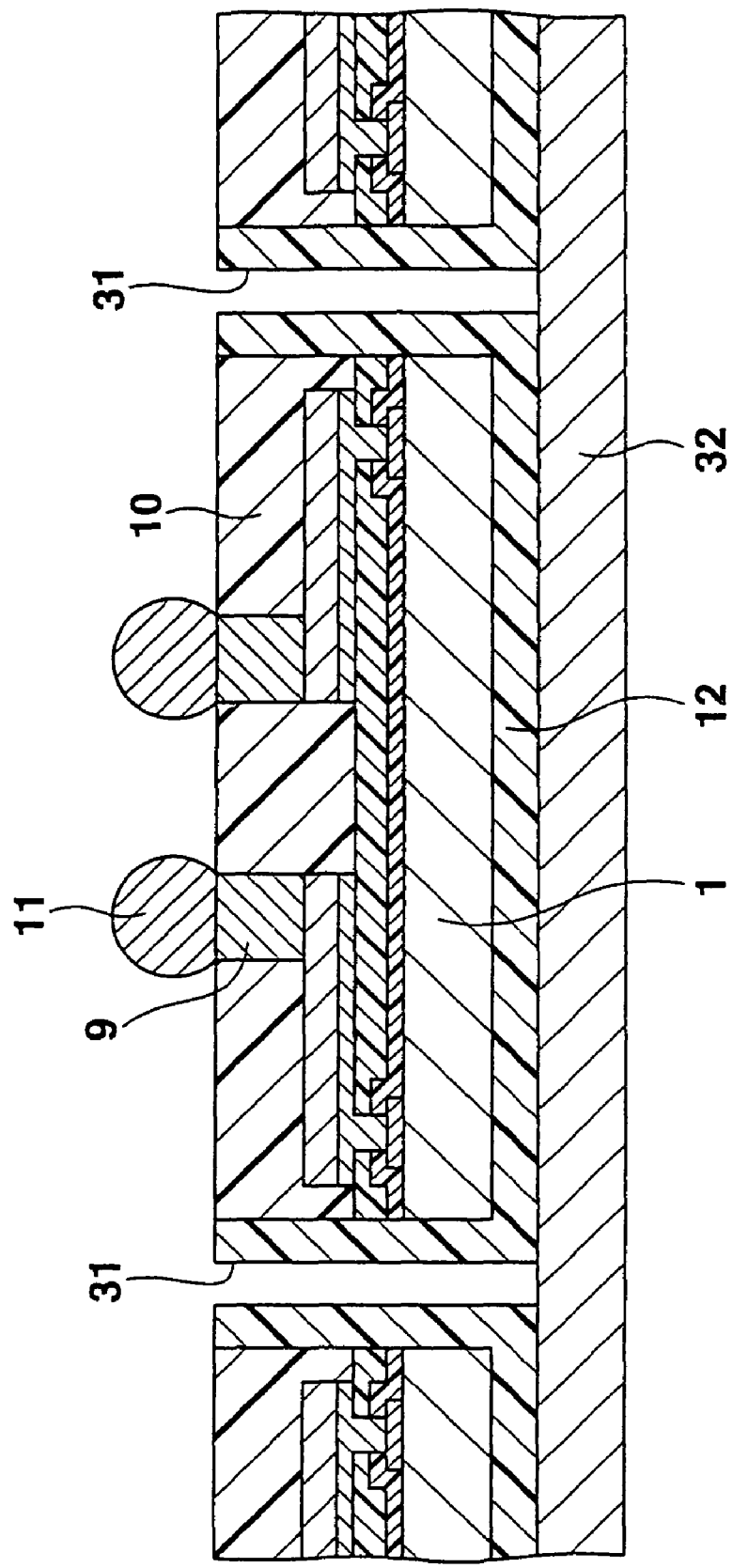
FIG. 19 is a cross-sectional view of a step following FIG. 18.

Next, as shown in FIG. 19, each solder ball 11 is formed on the upper surface of the columnar electrode 9. In this state, although the silicon substrate 1 including the first and second sealing films 10 and 12 and others is attached on the support film 32, it is divided into each chip by each groove 31. Thus, when the silicon substrate 1 including the first and second sealing films 10 and 12 and others is then peeled off from the support film 32, the plurality of semiconductor devices shown in FIG. 1 can be obtained.

THIRD EXAMPLE OF MANUFACTURING METHOD

Figure 20:
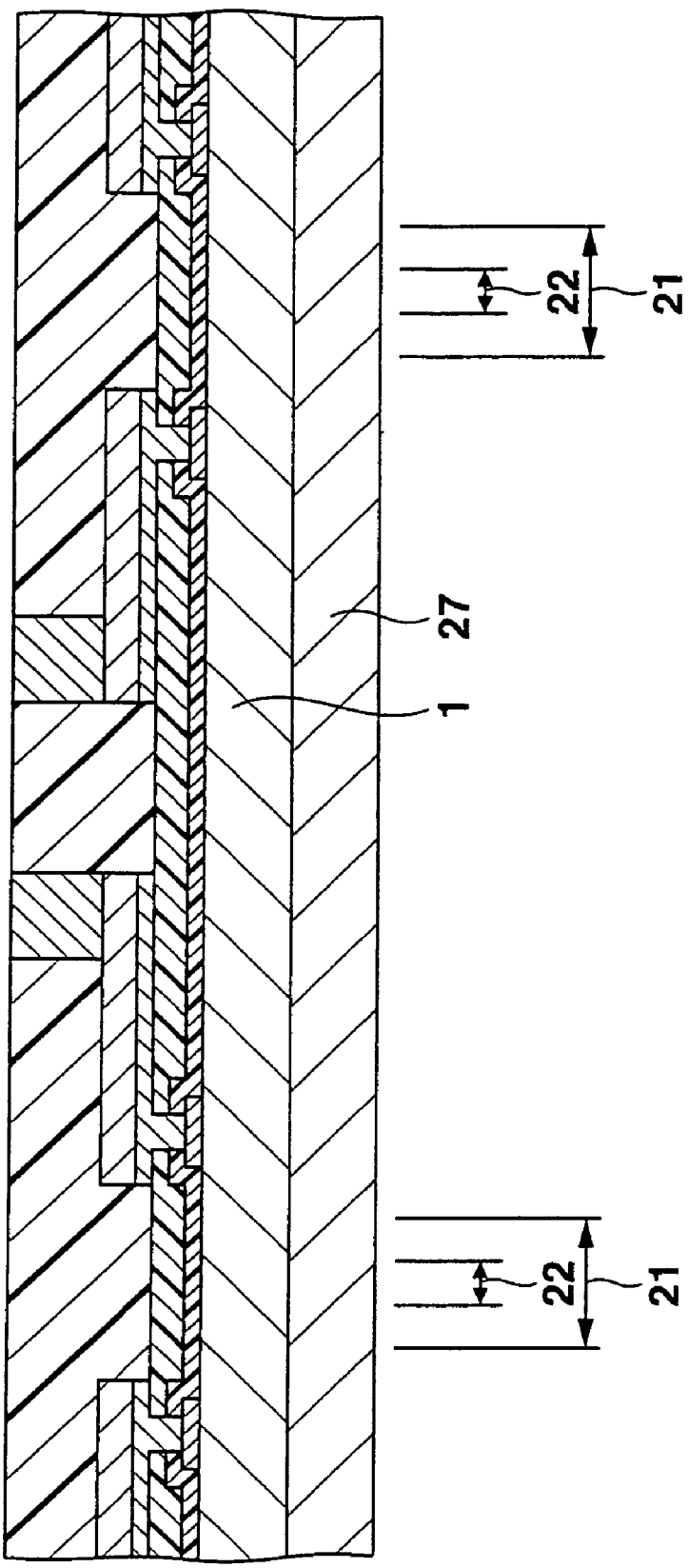
FIG. 20 is a cross-sectional view of a predetermined step in a third example of the manufacturing method of the semiconductor device depicted in FIG. 1.
Figure 21:
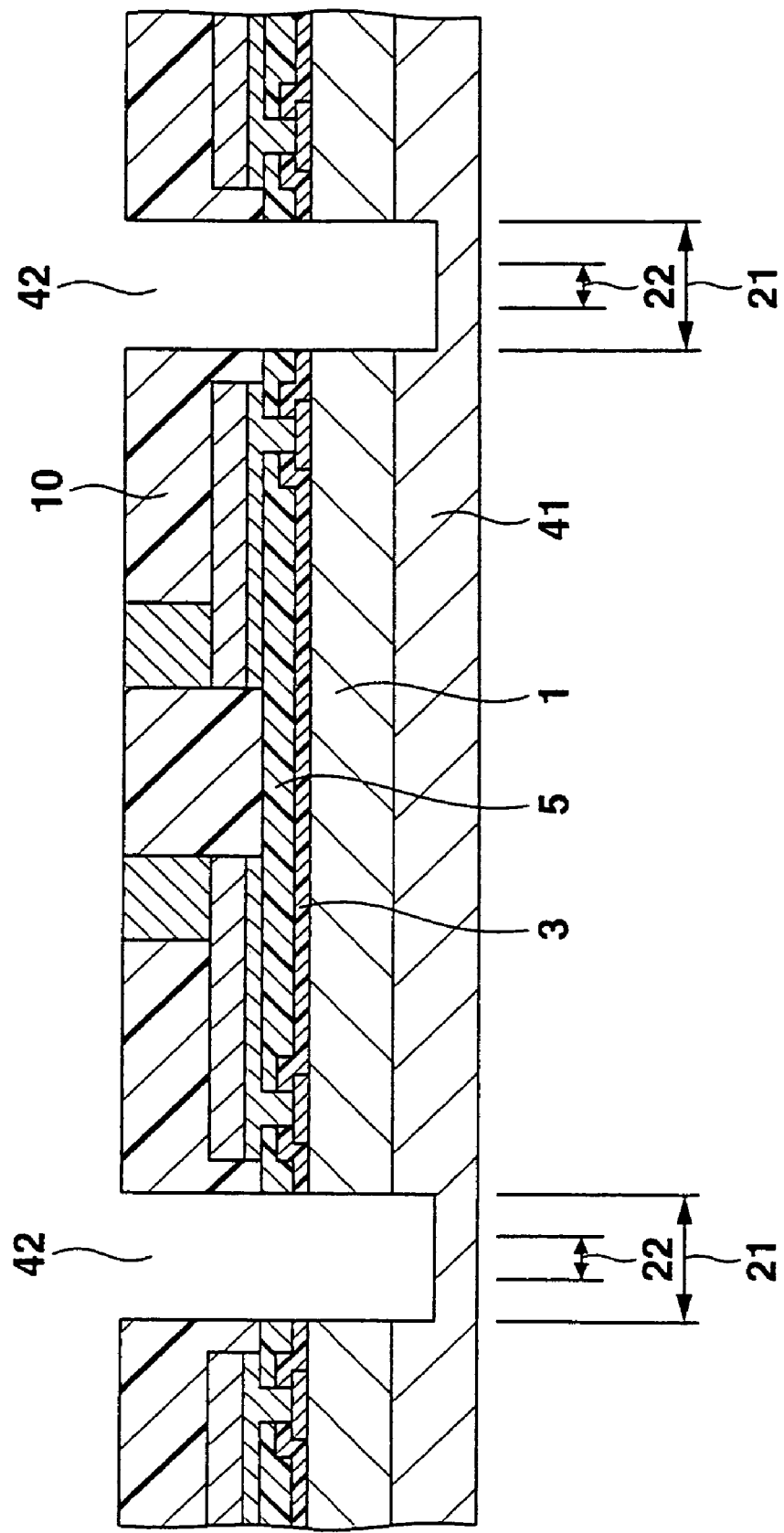
FIG. 21 is a cross-sectional view of a step following FIG. 20.

A third example of the manufacturing method of the semiconductor device shown in FIG. 1 will now be described. In this case, after the step shown in FIG. 7, the lower surface of the silicon substrate 1 is attached on an upper surface of a first dicing film 41 as shown in FIG. 20. Then, as shown in FIG. 21, the first sealing film 10, the protection film 5, the insulating film 3 and the silicon substrate 1 are fully cut along the first dicing street 21 by the dicing method, the laser cut method or the like. In this case, these members are likewise cut to an intermediate point of the dicing film 41 in the thickness direction. Then, the silicon substrate 1 in the wafer state is divided into each chip, but each chip is attached on the first dicing film 41, and hence each groove 42 is formed between the respective chips including the upper surface of the first dicing film 41, i.e., in a region corresponding to the first dicing street 21.

Figure 22:
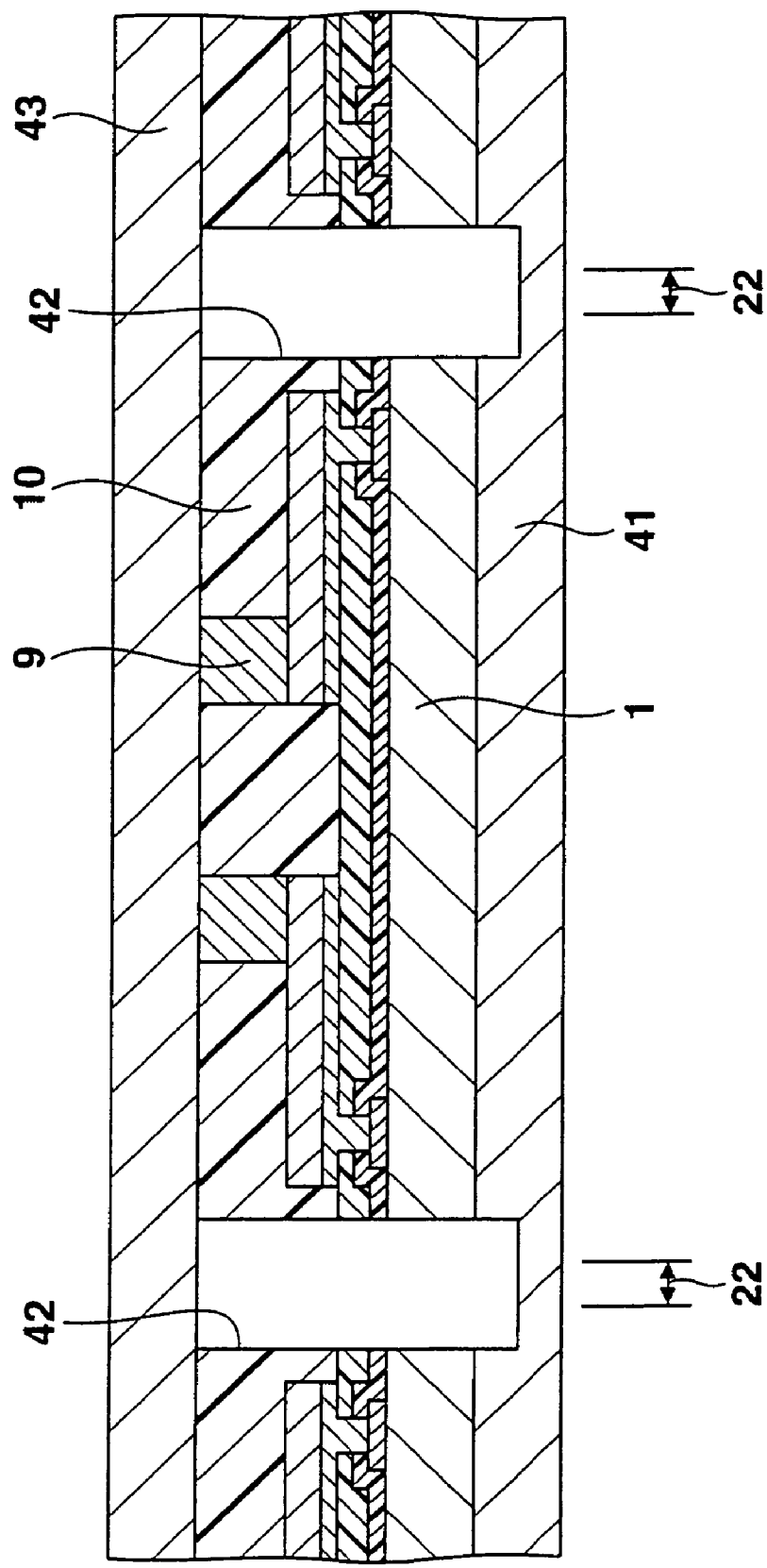
FIG. 22 is a cross-sectional view of a step following FIG. 21.
Figure 23:
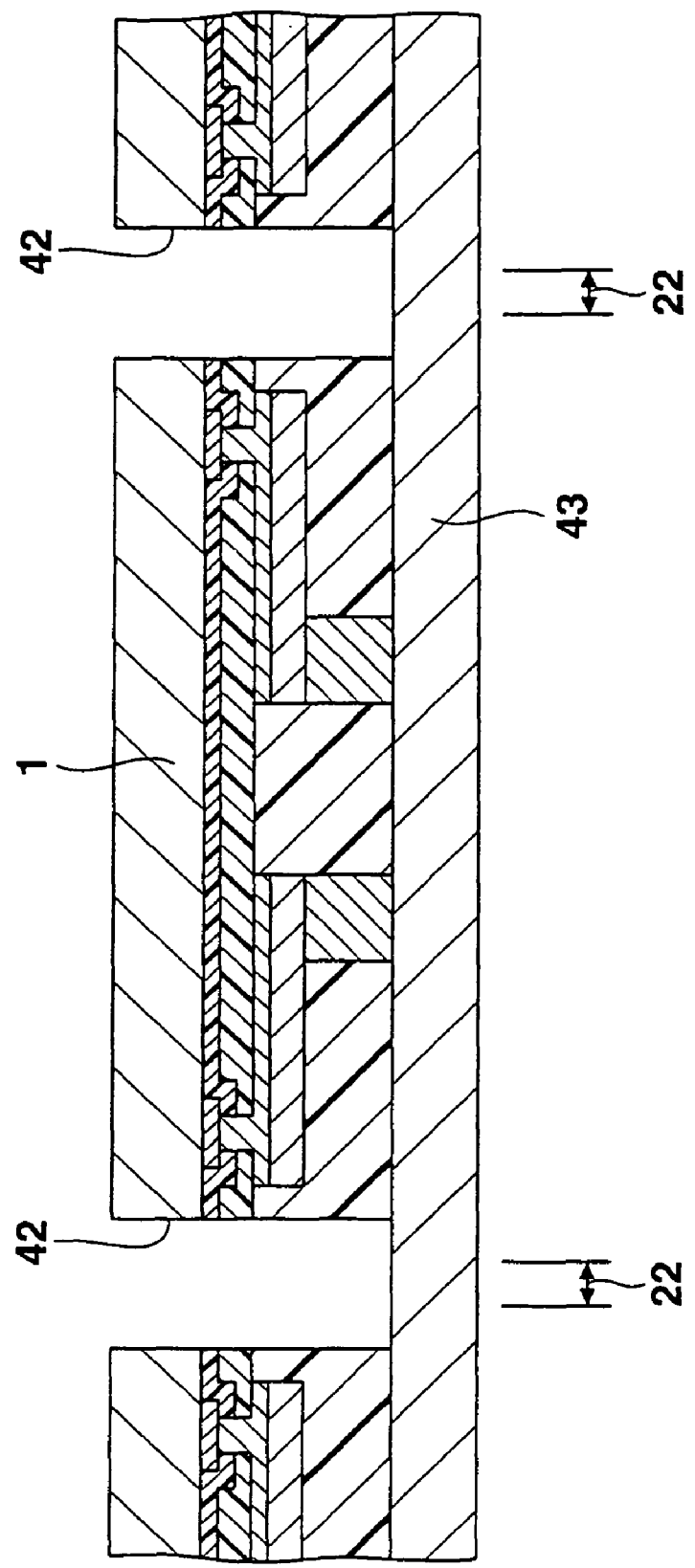
FIG. 23 is a cross-sectional view of a step following FIG. 22.
Figure 24:
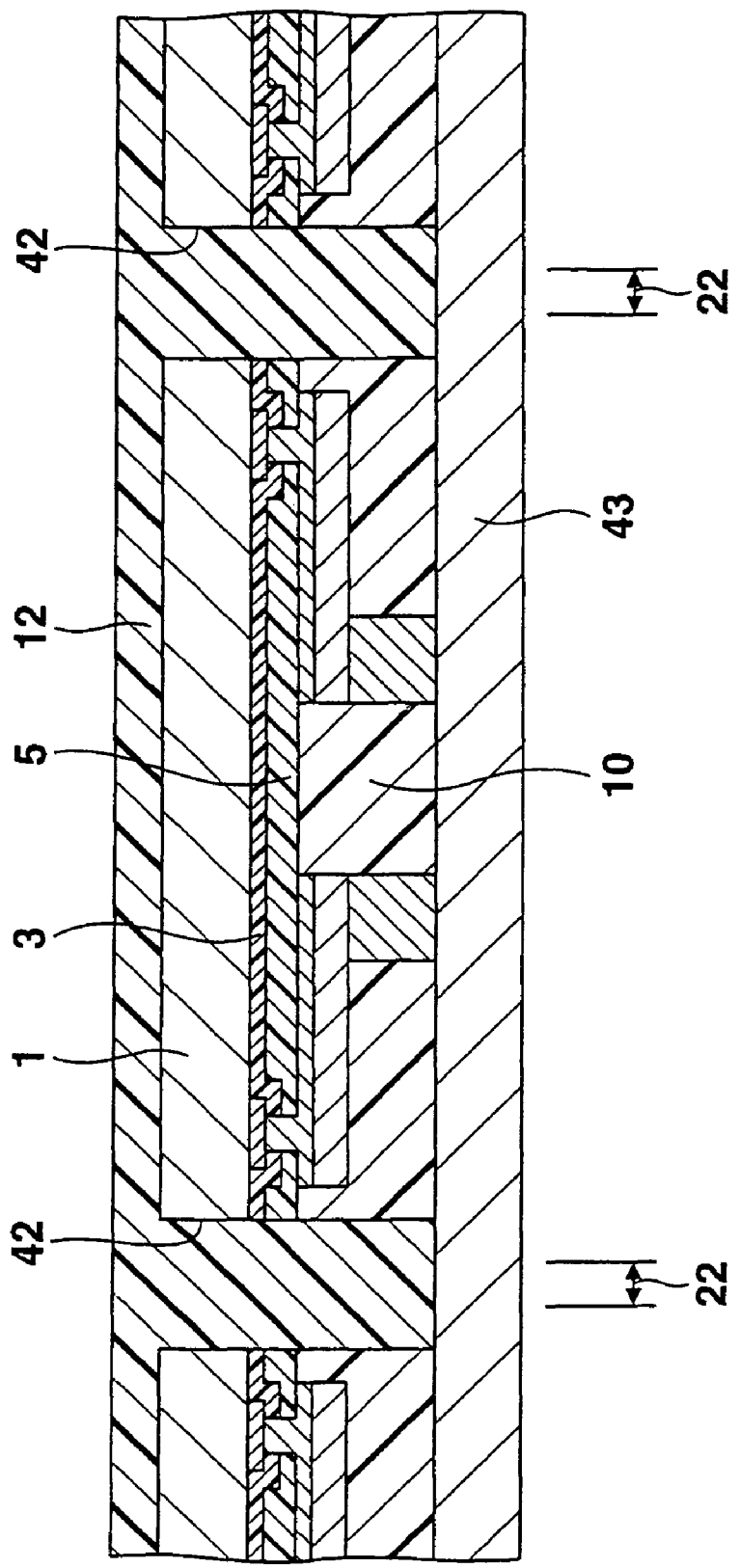
FIG. 24 is a cross-sectional view of a step following FIG. 23.

Next, as shown in FIG. 22, a second dicing film 43 is attached on the upper surface of the first sealing film 10 including the upper surface of the columnar electrode 9. Then, when the product shown in FIG. 22 is set upside down and the first dicing film 41 is peeled off, a state depicted in FIG. 23 can be obtained. Next, as shown in FIG. 24, the second sealing film 12 formed of the second sealing material is formed on the entire upper surface of the silicon substrate 1 including the inside of the groove 42 by the screen printing method, the spin coat method, the die coat method or the like in such a manner that the upper surface of the second sealing film 12 becomes flat.

In this state, the peripheral side surfaces of the silicon substrate 1, the insulating film 3, the protection film 5 and the first sealing film 10 are covered with the second sealing film 12 formed in the groove 42. Moreover, since the silicon substrate 1 is divided into each chip, the silicon substrate 1 can be hard to warp. Incidentally, when the second dicing film 43 is pulled and expanded in a peripheral direction thereof to thereby increase a width of the groove 42 and the second sealing material is applied in the groove 42 in this state, the second sealing material can be readily filled in the groove 42.

Figure 25:
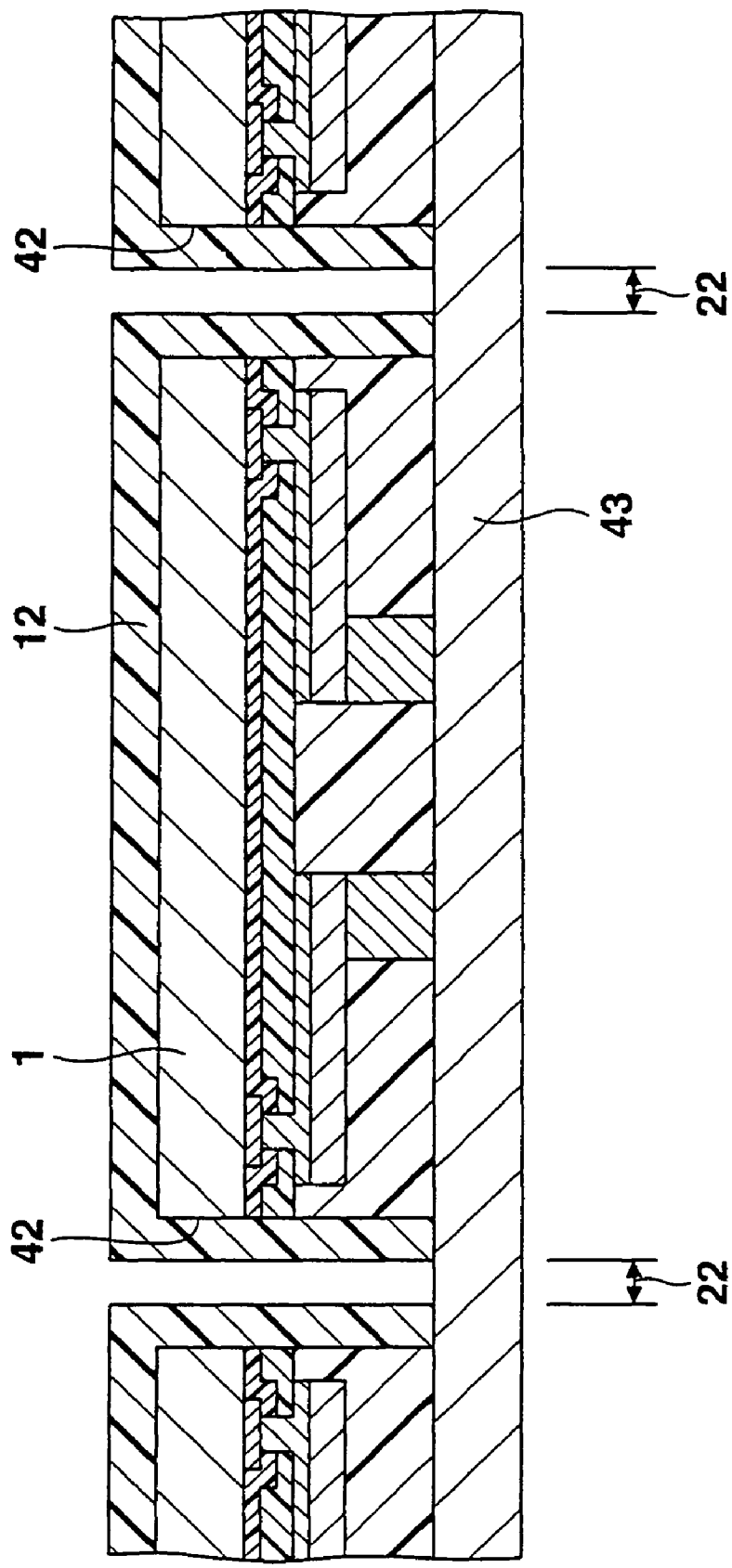
FIG. 25 is a cross-sectional view of a step following FIG. 24.
Figure 26:
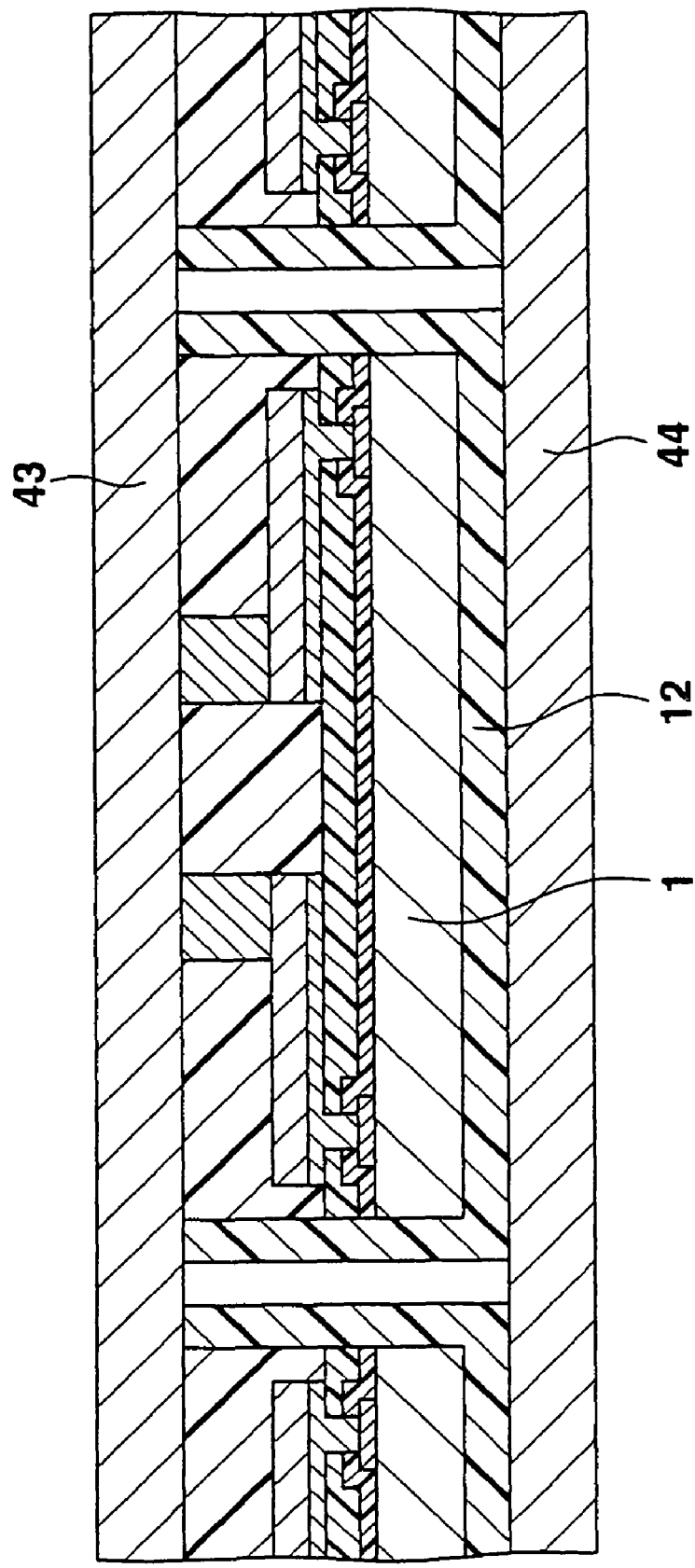
FIG. 26 is a cross-sectional view of a step following FIG. 25.

Next, as shown in FIG. 25, a central portion in a widthwise direction of the second sealing film 12 formed in the groove 42 is fully cut along the second dicing street 22 by the dicing method, the laser cut method or the like. Then, the product shown in FIG. 25 is set upside down, and the lower surface of the second sealing film 12 is attached on an upper surface of a support from 44 as depicted in FIG. 26. Next, when the dicing film 43 is peeled off, the same state as that shown in FIG. 18 can be obtained. Since subsequent steps are the same as those of the second example of the manufacturing method, a description of these steps will be eliminated. Meanwhile, in case of this manufacturing method, for example, since such a protruding portion 12b as shown in FIG. 17 is not formed, a polishing step of removing such a protruding portion 12b is not required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A manufacturing method of a semiconductor device comprising:
   preparing a semiconductor substrate in a wafer state which has a plurality of connection pads and a plurality of integrated circuits;
   forming a plurality of external connection electrodes on the semiconductor substrate in the wafer state;
   forming a first sealing film made of a first sealing material on the semiconductor substrate around the external connection electrodes, the first sealing material having each impurity concentration of an Na ion, a K ion, a Ca ion and a Cl ion which is not greater than 10 ppm;

cutting the semiconductor substrate in the wafer state and the first sealing film to form grooves having a predetermined width which divide the semiconductor substrate into each semiconductor substrate;

forming a second sealing film consisting of a second sealing material on a lower surface of the semiconductor substrates including the inside of the grooves, the second sealing material having a total impurity concentration of an Na ion, a K ion, a Ca ion and a Cl ion which is not smaller than 100 ppm; and cutting the second sealing film formed in the grooves on the inner side of the grooves having the predetermined width in order to divide the semiconductor substrate in the wafer state into the plurality of semiconductor substrates each having the integrated circuit and connection pad.

2. The manufacturing method of a semiconductor device according to claim 1, wherein forming the second sealing film on the lower surface of the semiconductor substrate in the wafer state including the inside of the grooves is based on one of a screen printing method, a spin coat method and a die coat method.

3. The manufacturing method of a semiconductor device according to claim 1, further comprising attaching a film on a surface of the first sealing film before forming the grooves having the predetermined width.

4. The manufacturing method of a semiconductor device according to claim 3, further comprising peeling the film attached on the surface of the first sealing film from the surface of the first sealing film after forming the second sealing film on the lower surface of the semiconductor substrate in the wafer state including the inside of the grooves.

5. The manufacturing method of a semiconductor device according to claim 3, wherein forming the grooves having the predetermined width has forming to an intermediate point in a thickness direction of the film attached on the surface of the first sealing film, and forming the second sealing film consisting of the second sealing material on the lower surface of the semiconductor substrates including the inside of the groove includes forming a part of the second sealing film formed in the groove to protrude from the surface of the first sealing film.

6. The manufacturing method of a semiconductor device according to claim 4, comprising removing the part of the second sealing film protruding from the surface of the first sealing film so that the surfaces of the first sealing film and the second sealing film are set on the same level after peeling the film.

7. The manufacturing method of a semiconductor device according to claim 4, comprising attaching a second film on the second sealing film formed on the lower surface of the semiconductor substrates before cutting the second sealing film formed in the grooves on the inner side of the grooves having the predetermined width.

8. A manufacturing method of a semiconductor device comprising:

preparing a semiconductor substrate in a wafer state which has a plurality of connection pads and a plurality of integrated circuits;

forming a plurality of external connection electrodes on the semiconductor substrate in the wafer state;

forming a first sealing film made of a first sealing material on the semiconductor substrate in the wafer state around the external connection electrodes, the first sealing material having each impurity concentration of an Na ion, a K ion, a Ca ion and a Cl ion which is not greater than 10 ppm;

attaching a lower surface of the semiconductor substrate in the wafer state on a first film;

cutting to an intermediate point of the first film, the semiconductor substrate in the wafer state and the first sealing film in a thickness direction to form grooves;

attaching a second film on an upper surface of the first sealing film and peeling the first film from the lower surface of the semiconductor substrate in the wafer state;

forming a second sealing film consisting of a second sealing material on the lower surface of the semiconductor substrate in the wafer state and the inside of the grooves, the second sealing material having a total impurity concentration of an Na ion, a K ion, a Ca ion and a Cl ion which is not smaller than 100 ppm; and cutting the second sealing film formed in the grooves on the inner side of the grooves having the predetermined width to divide the semiconductor substrate in the wafer state into the plurality of semiconductor substrates each having the integrated circuit and connection pad.

\* \* \* \* \*